(12) United States Patent
Di Ventra et al.

(10) Patent No.: US 9,911,080 B2
(45) Date of Patent: Mar. 6, 2018

(54) SELF-ORGANIZING LOGIC GATES AND CIRCUITS AND COMPLEX PROBLEM SOLVING WITH SELF-ORGANIZING CIRCUITS

(71) Applicant: The Regents of The University of California, Oakland, CA (US)

(72) Inventors: Massimiliano Di Ventra, Carlsbad, CA (US); Fabio Lorenzo Traversa, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/645,872

(22) Filed: Jul. 10, 2017

(65) Prior Publication Data
US 2017/0316309 A1 Nov. 2, 2017

Related U.S. Application Data

(63) Continuation of application No. PCT/US2016/041909, filed on Jul. 12, 2016.

(60) Provisional application No. 62/191,707, filed on Jul. 13, 2015.

(51) Int. Cl.
*G06N 3/08* (2006.01)
*G06N 3/063* (2006.01)
*H03K 19/20* (2006.01)

(52) U.S. Cl.
CPC ............... *G06N 3/063* (2013.01); *G06N 3/08* (2013.01); *H03K 19/20* (2013.01)

(58) Field of Classification Search
None
See application file for complete search history.

(56) References Cited

U.S. PATENT DOCUMENTS

| 8,274,312 | B2 | 9/2012 | Pino et al. | |
|---|---|---|---|---|
| 8,773,167 | B2* | 7/2014 | Robinett | G11C 13/0007 326/104 |
| 9,406,016 | B2* | 8/2016 | Pino | G06N 3/02 |
| 2003/0058697 | A1 | 3/2003 | Tour et al. | |
| 2011/0106742 | A1* | 5/2011 | Pino | G06N 3/0635 706/33 |
| 2015/0019468 | A1 | 1/2015 | Nugent et al. | |

OTHER PUBLICATIONS

International Search Report dated Sep. 29, 2016 for International Patent Application No. PCT/US16/41909, 3 pages.
PCT Written Opinion dated Sep. 29, 2016 for International Patent Application No. PCT/US16/41909, 6 pages.
Yang, et al., "A memristor emulator as a replacement of a real memristor," Semicond. Sci. Technol. 30, Dec. 5, 2014.

(Continued)

*Primary Examiner* — Jany Richardson
(74) *Attorney, Agent, or Firm* — Knobbe, Martens, Olson & Bear, LLP

(57) ABSTRACT

Self-organizing logic gates formed from a combination of memristor devices and dynamic correction modules configured to provide a stable operation upon application of a signal to any terminal. A SOLG of the invention can accept signals from any terminal and does not require an absence of signals at any other terminal. Terminal signals can superpose and the gate finds equilibrium, if an equilibrium exists.

20 Claims, 16 Drawing Sheets

(56) References Cited

OTHER PUBLICATIONS

Snider, "Self-organized computation with unreliable, memristive nanodevices," Nanotechnology 18, Aug. 10, 2007.
Borghetti, et al., "A hybrid nanomemristor/transistor logic circuit capable of self-programming," PNAS, Feb. 10, 2009, vol. 106, No. 6, pp. 1699-1703.
Traversa, et al., "Universal Memcomputing Machines," revised Nov. 2014, published in IEEE Transaction on Neural Networks and Learning Systems, vol. 26, Issue 11, Feb. 3, 2015.
Traversa, et al., "Memcomputing NP-complete problems in polynomial time using polynomial resources and collective states," Sci. Adv. 2015, Jul. 3, 2015.
Traversa, et al., "Polynomial-time solution of prime factorization and NP-hard problems with digital memcomputing machines," revised Apr. 22, 2016, published in Chaos: An Interdisciplinary Journal of Nonlinear Science, vol. 27, Issue 2, Feb. 2017.
Di Ventra, et al., On the physical properties of memristive, memcapacitive and meminductive systems, Nanotechnology, vol. 24. May 2013.
Eshraghian, et al, "Memristive device fundamentals and modeling Applications to circuits and systems simulation," Proceedings of the IEEE, vol. 100, No. 6, pp. 1991-2007, Jun. 2012.
Chua, et al. "Memristive devices and systems," Proc. of the IEEE, vol. 64, Issue 2, 1976.

\* cited by examiner

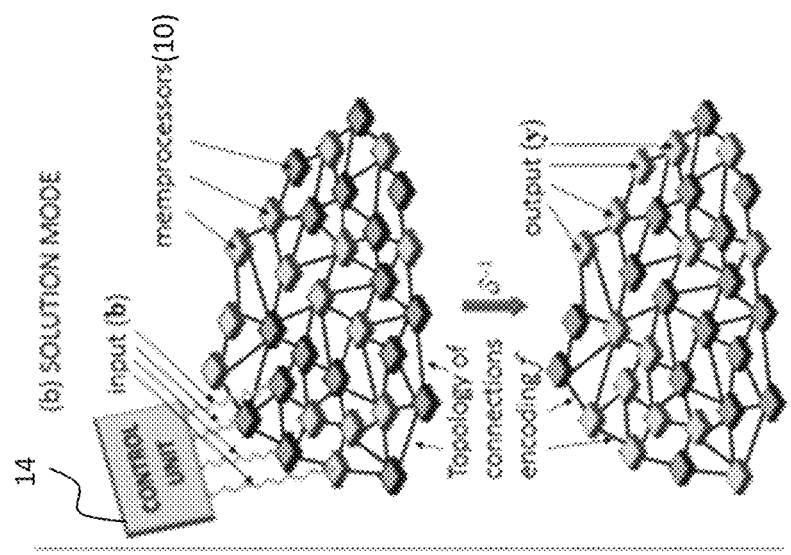
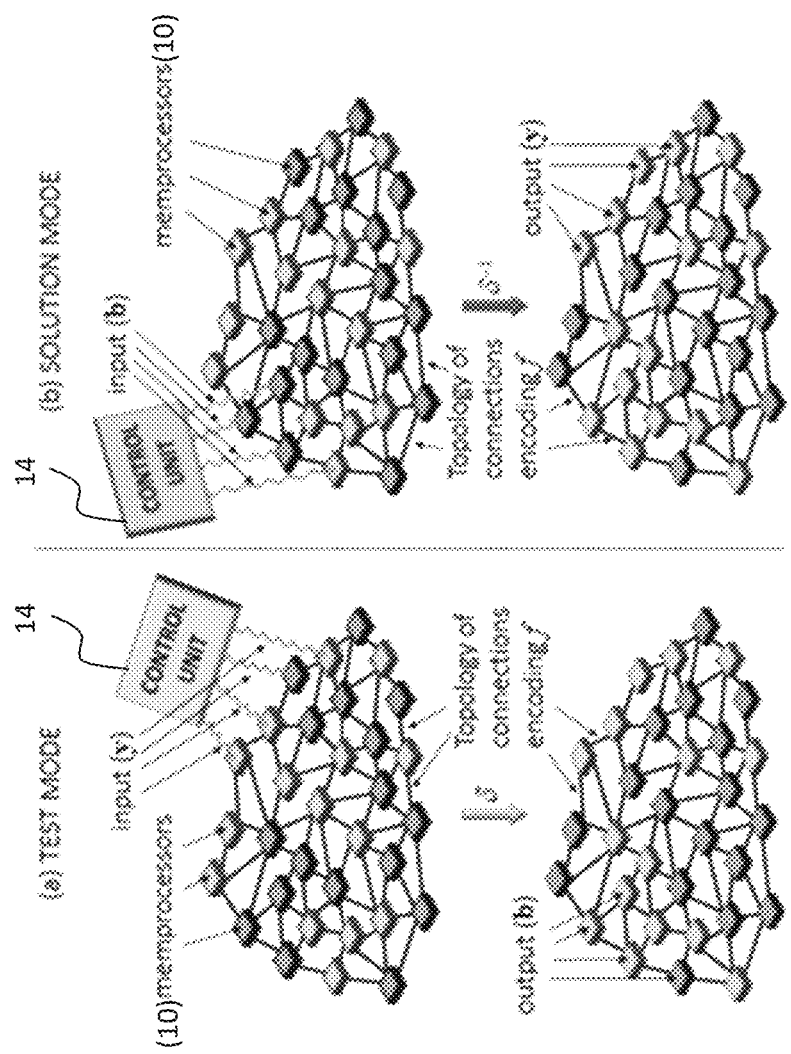
FIG. 1A
FIG. 1B

SELF-ORGANIZING LOGIC GATE

STANDARD LOGIC GATE

FIG. 4A
Logic relation satisfied ⇔ Stable signal configuration
$b_0 = b_1 \& b_2$
FIG. 4B
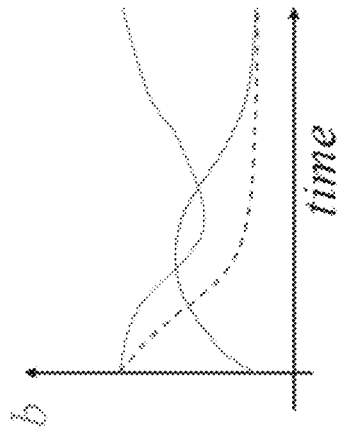
FIG. 4C
Logic relation not satisfied ⇔ Unstable signal configuration
$b_0 \neq b_1 \& b_2$
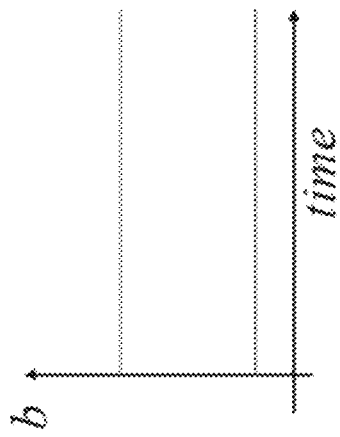

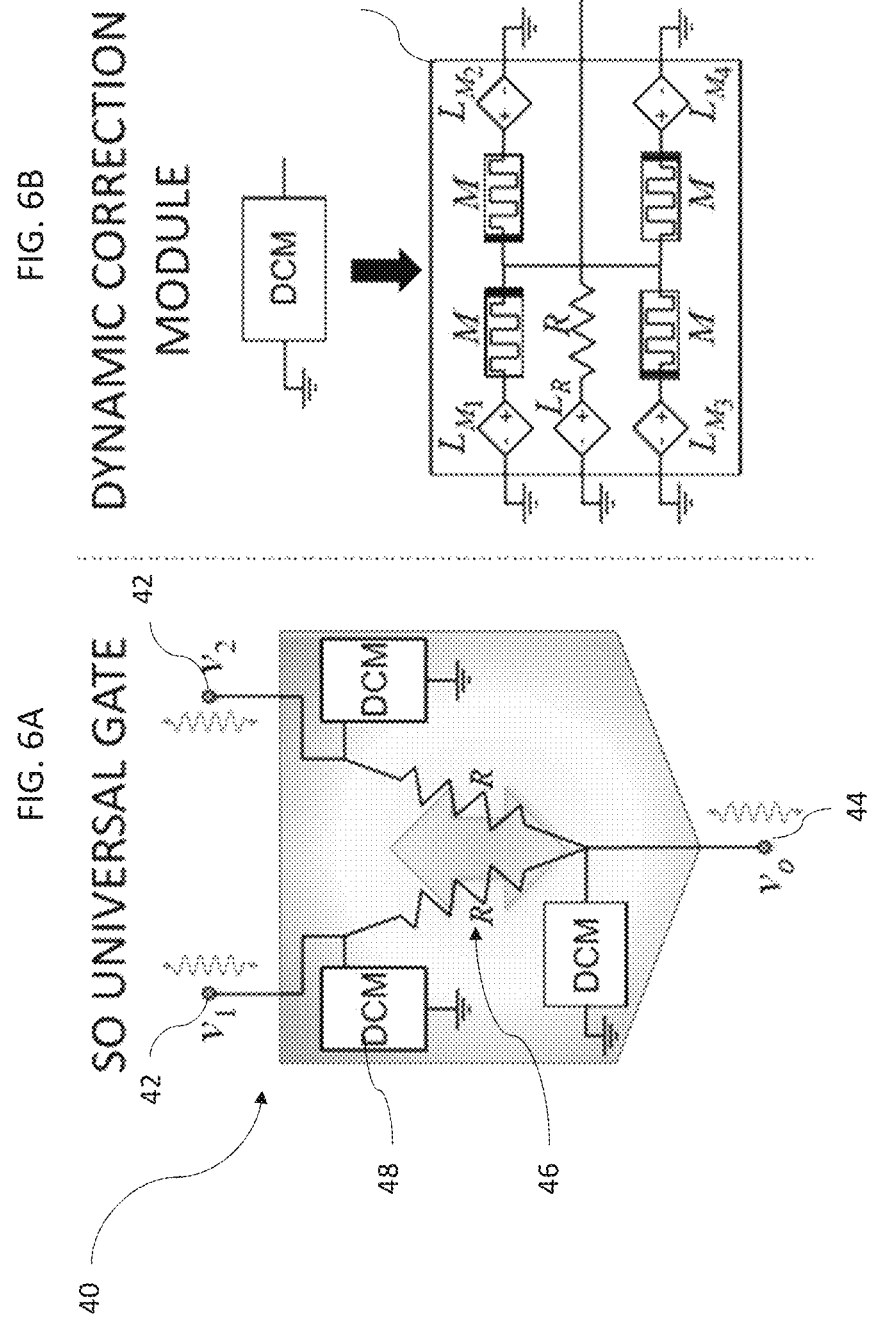

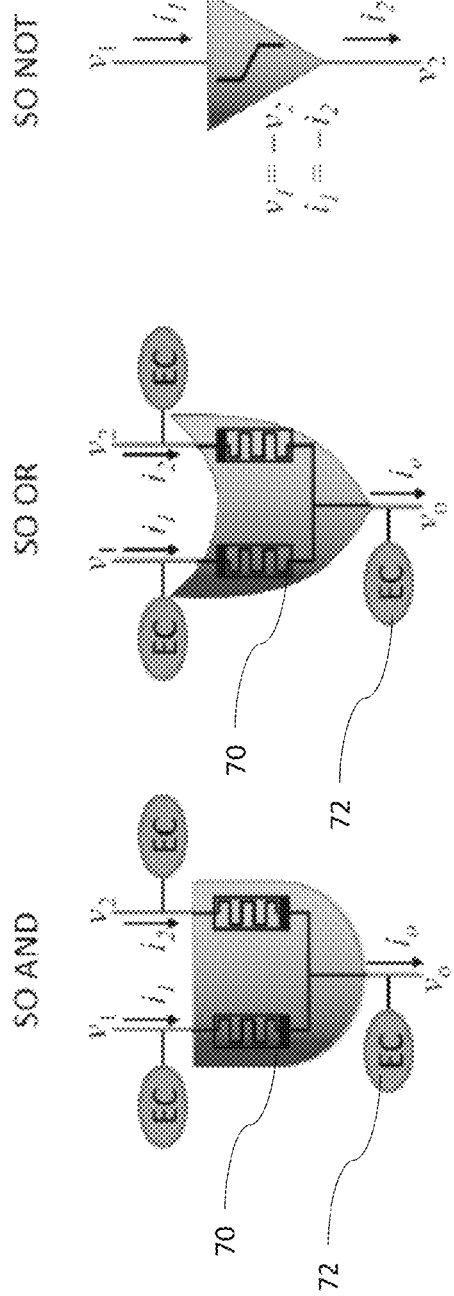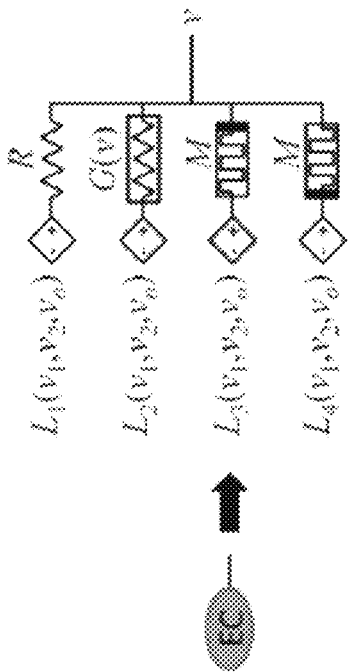
FIG. 13A
FIG. 13B
FIG. 13C
FIG. 13D

SELF-ORGANIZING LOGIC GATES AND CIRCUITS AND COMPLEX PROBLEM SOLVING WITH SELF-ORGANIZING CIRCUITS

PRIORITY CLAIM AND REFERENCE TO RELATED APPLICATIONS

Any and all applications for which a foreign or domestic priority claim is identified in the Application Data Sheet as filed with the present application are hereby incorporated by reference under 37 CFR § 1.57. This application is a continuation of International Application No. PCT/US2016/041909, filed Jul. 12, 2016, which claims priority under 35 U.S.C. § 119 and all applicable laws, statutes and treaties from prior U.S. provisional application No. 62/191,707, which was filed on Jul. 13, 2015.

FIELD

Fields of the invention include digital circuits and architectures, mixed analog-digital circuits and architectures and neuromorphic circuits and architectures. Practical applications include many fields with complex problems that often rely upon expensive approximations, including the examples of computer vision, artificial intelligence, large scale simulations, such as VLSI tools, and encryption.

BACKGROUND

For many years, researchers have been trying to design computer systems that could efficiently solve what are termed NP problems, which include NP complete and NP hard problems. NP hard problems are problems which are unsolvable within a reasonable amount of time for large input sizes. However, it is sometimes possible to reach approximate solutions. They can be easily solved for small input sizes but they grow exponentially as more variables are added, rendering them unsolvable for modern computers. As a result, many complex problems are solved in parts or using approximations, with the final answer being computationally costly and imprecise. There remains no digital system known to the inventors capable of solving such problems, which therefore are handled in practice via expensive approximations and heuristic methods.

Standard CMOS technology is limited because it can only output the solution bit given the initial input bits. As a consequence, such circuits composed of standard logic gates only operate sequentially.

SUMMARY OF THE INVENTION

Embodiment of the invention includes a self-organizing logic gate, set of self-organizing logic gates and self-organizing circuits. Preferred embodiments are memcomputing architectures that provide forward logic (input to output) like a traditional logic chip, and also provide reverse logic (output to input). A preferred method solves complex problems using the forward and reverse logic at the same time. We call the simultaneous embodiment of forward and reverse logic self-organizing (SO) logic. The use of SO logic speeds up the solutions of the NP problems. NP problems that require exponentially growing resources (in space, time and energy) depending on the input length when solved with forward logic, can be solved with only polynomial resources when solved with SO logic. This is a direct consequence of the definition of NP problems through Boolean circuits.

Preferred embodiments of the invention also provide a self-organizing logic gate and circuit emulator. The emulator can be in the form of code that causes a machine to emulate self-organizing logic gates and circuits. The emulator emulates memcomputing architectures that provide forward logic (input to output) like a traditional logic chip, and also provide reverse logic (output to input). The emulator can solve complex problems using SO logic. The use of SO logic speeds up the solutions of the NP problems. NP problems that require exponentially growing resources depending on the input length when solved with forward logic, can be solved with only polynomial resources when solved with SO logic.

BRIEF DESCRIPTION OF THE DRAWINGS

FIGS. 1A and 1B are schematic diagrams that respectively illustrate test and solution modes of a Universal Memcomputing Machine (UMM);

FIGS. 4A-4C respectively illustrate a stable configuration of an SOLG AND (SO-AND) gate of the invention, the SO-AND gate and an unstable configuration of the SO-AND gate;

FIG. 6A is illustrates a universal SOLG of the invention and FIG. 6B a dynamic correction module of the universal SOLG;

DETAILED DESCRIPTION OF THE PREFERRED EMBODIMENTS

Figure 2:
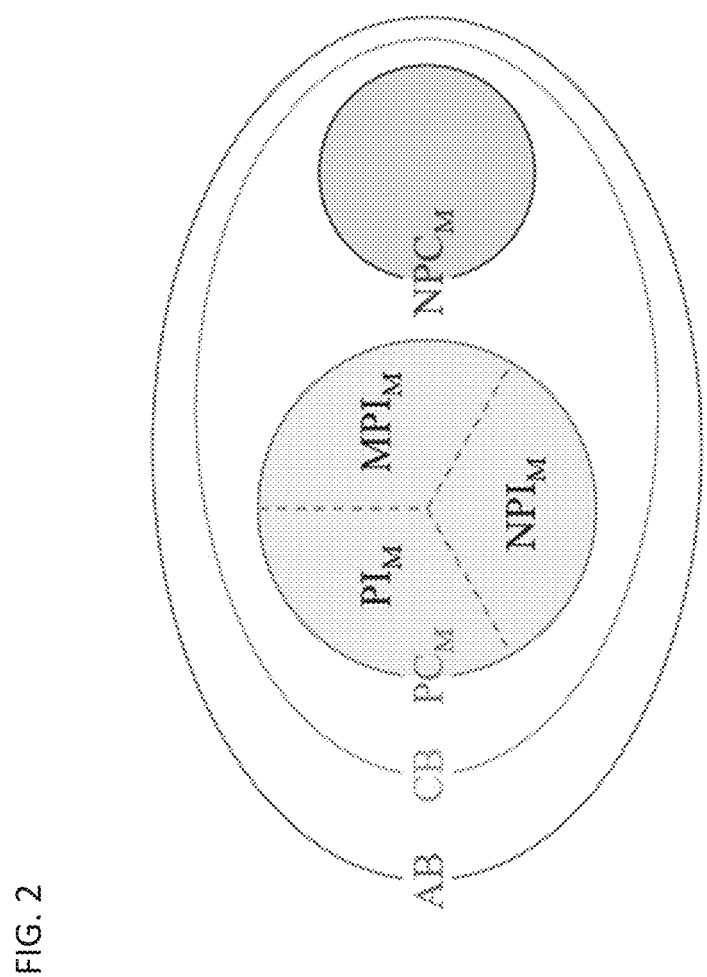
FIG. 2 is a Euler diagram of the complexity classes for a digital memcomputing machine (DMM)

An embodiment of the invention is a self-organizing logic gate (SOLG). The SOLG includes a combination of memristor devices and dynamic correction modules configured to provide a stable operation upon application of a signal to any terminal. A SOLG of the invention can accept signals from any terminal and does not require an absence of signals at any other terminal. Terminal signals can superpose and the gate finds equilibrium (no current flow from any terminal), if an equilibrium exists.

As used herein, memristor device includes memristors or transistor-based circuits that provide memristive behavior. [L. Chua, S. M. Kang, memristive devices and systems, Proc. of the IEEE, vol. 64, is. 2, pg. 209 (1976)]. Preferred embodiments include physical circuits, fabricated with conventional semiconductor fabrication techniques. Additional preferred embodiments include virtual circuits that are emulated by codes to model SOLG and circuits from SOLG. Those knowledgeable in the art will therefore appreciate that virtual circuit embodiments of the present invention lend themselves well to practice in the form of computer program products. Accordingly, it will be appreciated that embodiments of the present invention may comprise computer program products comprising computer executable instructions stored on a non-transitory computer readable medium that, when executed, cause a computer to undertake methods according to the present invention, or a computer configured to carry out such methods. The executable instructions may comprise computer program language instructions that have been compiled into a machine-readable format. The non-transitory computer-readable medium may comprise, by way of example, a magnetic, optical, signal-based, and/or circuitry medium useful for storing data. The instructions may be downloaded entirely or in part from a networked computer. Also, it will be appreciated that the term "computer" as used herein is intended to broadly refer to any machine capable of reading and executing recorded instructions. It will also be understood that results of methods of the present invention may be displayed on one or more monitors or displays (e.g., as text, graphics, charts, code, etc.), printed on suitable media, stored in appropriate memory or storage, etc.

An embodiment of the invention is a self-organizing logic gate and circuit. Preferred embodiments are memcomputing architectures that provide forward logic (input to output) like a traditional logic chip, and also provide reverse (output to input) logic. The use of SO logic speeds up the solutions of the NP problems. NP problems that requires exponential growing resources depending of the input length when solved with forward logic, can be solved with only polynomial resources when solved with SO logic. This is a direct consequence of the definition of NP problems through Boolean circuits.

We have recently shown that a new class of non-Turing machines, which we have named Universal Memcomputing Machines (UMMs), has the same computational power of nondeterministic Turing machines, and as such they can solve NP-complete/hard problems with polynomial resources. See, F. L. Traversa and M. Di Ventra, "Universal memcomputing machines," IEEE Trans. Neural Netw. Learn. Syst. vol. 26 is. 11 pg. 2702 (2015). UMMs are machines composed of interacting memprocessors, which are elemental units that use memory to both process and store information on the same physical location. Their computational power rests on their intrinsic parallelism—in that the collective state of the machine (rather than the individual memprocessors) computes—and their information overhead: a type of information that is embedded in the machine but not necessarily stored by it.

Preferred embodiments provide self-organizing logic gates (SOLGs). Preferred embodiments provide a complete set of logic gates. Preferred SOLG of the invention include memristors and standard transistors, and others include transistor circuits that form memristor devices by providing memristive behavior. SOLG of the invention include memristors, emulators of memristors, and standard transistors configured to provide memristive behavior. The gates of the invention are able to function as regular logic gates by solving for the input bits, but importantly, the gates of the invention can also work reversibly by fixing the output bit and finding the input bits that give rise to that output. The gates of the invention self-organize themselves into the final solution. Self-organizing logic circuits of the invention employ SOLGs to enable many operations that standard logic circuits cannot perform. While not being bound by this theory and the theory being unnecessary to basic inventive nature of the present gates and circuits, the inventors believe that the present self-organizing logic gates and circuits represent a fundamental conceptual departure from the standard logic gates and circuits that are used in all forms of state of the art electronics.

The present invention provides all logic gates, such as AND, OR, XOR, NOT, NOR NAND and any other one that can work as standard gates by varying the input and obtaining the output. However, the gates of the invention also provide a reverse operation, enabling operations that vary the output to obtain the input that produces that output.

A standard n-terminal logic gate with m inputs and n-m outputs follows the paradigm in which inputs terminals take the signals, the gate processes the inputs and sends to the output terminals the output of the computation. The self-organizing logic gates of the invention can use any terminal at the same time as input and output terminal, i.e., signals can go in and out at the same time at any terminal resulting in a superposition of input and output signals. The gate changes dynamically the outgoing components of the signals depending on the incoming components according to some rules aimed at satisfying the logic relations of the gate.

Preferred SOLG can have either stable configurations, i.e., the configuration of the signals at the terminals that satisfies the logic relation required (such as a logical AND or an OR relation) and the signals remain constant in time, or an unstable configuration: the signals at the terminals do not satisfy any traditional logic relation so the SOLG drives the outgoing components of the signal to finally obtain a stable configuration.

Preferred embodiments also provide self-organizing logic circuits (SOLC). A group of SOLGs is combined to provide a preferred SOLC. An example of self-organizing logic circuit is formed by a network of self-organizing AND gates. The external inputs are sent to some nodes related to the computational task required. The self-organizing circuit organizes itself by finding a stable configuration that satisfies the logic proposition and then the solution is read at the output nodes. At each node of a SOLG an external input signal can be sent and the output can be read at other nodes of the SOLC. The connections of the circuit are related to a specific computational task required by the circuit. The topology of the connections and the specific logic gates used are not necessarily unique and can be derived from standard Boolean logic circuit theory.

The SOLC can be viewed mathematically as a subclass of non-Turing machines called memcomputing machines [F. L. Traversa, M. Di Ventra, Universal Memcomputing Machines, IEEE Trans. Neur. Nets. & Learn. Sys. vol. 26 is. 11 pg. 2702 (2015) DOI: 10.1109/TNNLS.2015.2391182]. However, from a design purpose, the SOLGs and SOLCs can be viewed as dynamical systems [L. Perko, Differential Equations and Dynamical Systems, Springer]. This point of view is more useful since any electronic circuit can be described by a dynamical system, thus the properties required by the dynamical system to behave properly directly reflect into the electronic circuit.

In this respect, the SOLC can be mathematically defined as follows: Given a problem P to be solved, and mapped into a Boolean circuit B, the SOLC is a network of SOLGs with the topology defined by B; the dynamics of the SOLC is described by a dynamical system that has equilibrium points associated to the solutions of P. Once the SOLC is fed with the input signal, if the initial state belongs to the basin of attraction of an equilibrium point, the system converges exponentially fast to the equilibrium point and then the solution of the problem can be read.

The SOLGs in preferred embodiments are formed from a combination of memristor devices or emulations thereof and standard transistors. Examples includes self-organizing AND, OR, XOR and NOT gates. The logical 0 and 1 are encoded into the potential at the terminal of the SOLGs. For example, we can choose a reference voltage $v_c$ such that terminals with voltage c encode the logic 1s and terminals with voltage $-v_c$ encode logic 0s. The self-organizing AND and OR gates can be realized using memristors. The memristor itself can be either emulated using standard CMOS technology or directly built in several ways. The self-organizing gates are completed by adding a specified dynamic correction module at each terminal. The dynamic correction module is formed by a resistance R, a nonlinear conductance $G(v)=-(v-v_c)(v+v_c)$, and two identical memristors M with different polarizations.

A self-organizing NOT is a two port electronic device that must satisfy $v_1=v_2$ and $i_1=i_2$. This can be achieved in several ways using standard microelectronic components. A SO NOT can contain memristors or not. One form is a SO XOR gate with the output terminal fed by a logic 1.

The SOLGs form a complete basis set of Boolean algebra, so any Boolean function can be expressed as a combination of self-organizing AND, OR and NOT and any other gate. Self-organizing logic gates of the invention are capable of solving standard computational problems as well as computational problems with polynomial resources (space, time and energy) problems that, using normal Boolean logic, are solved with exponential resources.

The connections between logic gates should be configured such that the currents used as dynamic correction signal could rise or lower the potentials at nodes.

As another example of the power of the self-organizing logic gates and circuits of the invention, standard algorithms for division of floating point numbers require several steps for dividing the mantissas of two numbers. By contrast, using a SOLC of the invention makes it possible, in one computation step, to determine the quotient of two mantissas with a required accuracy. To state the problem, we want to divide the numbers a and b, i.e., we want to find the number c such that c=a/b. The SOLC can actually implement cb=a. This implementation in binary representation with finite number of bits requires additional bits for the accuracy of the calculation (an exhaustive treatment of the accuracy of the calculation can be demonstrated and would be understood by artisans, but is not necessary to understand the powerful benefits of the present logic circuits). In order to implement the product in Boolean logic, we need the 2 and 3-bit adder gates composed as usual from logic gates. Extensive numerical simulations of these self-organizing logic gates showed that they operate as expected.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

Our previous work with colleagues provides a machine that solves the NP-complete version of the subset-sum problem in one computational step using a linear number of memprocessors, and this machine was constructed using standard electronic components. F. L. Traversa, C. Ramella, F. Bonani, and M. Di Ventra, "Memcomputing NP-complete problems in polynomial time using polynomial resources and collective states," Science Advances, vol. 1, no. 6, p. e1500031 (2015).

That machine was fully analog and as such cannot be easily scaled up to an arbitrary number of memprocessors without noise control. The present invention provides digital mode UMMs that are scalable machines capable of solving very complex problems using resources that only grow polynomially with input size. These are referred to as DMMs (digital memcomputing machines). To illustrate the functionality and practicality of the present digital UMMs, the present digital UMMs are applied to exemplary: prime factorization and the NP-hard version of the subset-sum problem. Artisan will appreciate the much wider applicability of the DMMs, however.

Before defining the DMMs, we define example problems to solve. Artisans will appreciate that the DMMs have broader application, but the example problems are useful to demonstrate utility and operation of the DMMs.

Compact Boolean Problems

Definition II.1 A Compact Boolean problem is a collection of statements (not necessarily independent) that can be written as a finite system of Boolean functions. Formally, let $f: \mathbb{Z}_2^n \to \mathbb{Z}_2^m$ be a system of Boolean functions and $\mathbb{Z}_2=\{0, 1\}$, then a CB problem requires to find a solution $y \in \mathbb{Z}_2^n$ (if it exists) of $f(y)=b$ with $b \in \mathbb{Z}_2^m$ This definition encompasses many important problems in Computer Science, such as the Nondeterministic Polynomial-(NP-) time problems, linear algebra problems, and many others. Specific example problems include factorization and the subset-sum problem.

Direct and Inverse Protocols.

We further define two ways (protocols) to find a solution of such problems. The first one can be implemented within the Turing machine paradigm through standard Boolean circuits. The second one can only be implemented with DMMs.

Definition II.2 Let $S_B=\{g_1, \ldots, g_k\}$ be a set of k Boolean functions $g_j: \mathbb{Z}_2^{n_j} \to \mathbb{Z}_2^{m_j}$, $S_{CFS}=\{s_1, \ldots, s_h\}$ a set of h control flow statements, and CF the control flow that specifies the sequence of the functions $g_j \in S_B$ to be evaluated and the statements $s_j \in S_{CFS}$ to be executed. We then define the Direct Protocol (DP) for solving a CB problem that control flow CF which takes $y' \in \mathbb{Z}_2^m$ as initial input and gives $y \in \mathbb{Z}_2^n$ as final output such that $f(y)=b$ Generally speaking, the DP is the ordered set of instructions (the program) that a Turing machine should perform to solve a CB problem. Even if a DP is not the unique way to find a solution of a given CB problem with Turing machines, all the other known strategies (even if they are, possibly, more optimal) do not change the computational complexity classes of Turing machines. For this reason, we consider here only DPs as some general Turing-implementable strategies for solving CB problems.

Boolean functions are not, in general, invertible and finding the solution of a CB problem is not equivalent to finding the zeros of a vector function f because the solution belongs to $\mathbb{Z}_2^n$ and not to $\mathbb{R}^n$ or $\mathbb{C}^n$. Nevertheless, we can still think of a strategy to find the solution of a CB problem that can be implemented in a specific machine. This means that the machine must be designed specifically to solve only such a CB problem. Specific examples provided below solve factorization and the NP-hard version of the subset-sum problem. We then define:

Definition II.3 An Inverse Protocol (IP) is that which finds a solution of a given CB problem by encoding the Boolean system $f$ into a machine capable of accepting as input b, and giving back as output y, solution of $f(y)=b$. The IP can be considered an "inversion" of $f$ using special purpose machines.

Algorithmic Boolean Problems

Definition II.4 The Algorithmic Boolean (AB) problems are those problems described by a collection of statements mathematically formalized by a control flow with Boolean functions and appropriate control flow statements.

The CB problems are clearly a subclass of AB problems. However, it is not easy to say a priori if an AB problem can be reduced to a CB problem. For example, control flows including loops that terminate only if a condition is met cannot be always translated into a finite system $f$ of Boolean functions. Moreover, the same problem that can be formulated either as CB or AB, may not have the same complexity in the respective formulation. For example, in order to reduce $f$ to a unique Boolean system, if we consider a control flow CF that requires the evaluation of $n_B$ Boolean functions and $n_C$ conditional branches (i.e., the "if-then" statements that are a specific case of control flow statements), we may need resources increasing with the dimension of $f$ which, in turn, increases non-polynomially with $n_C$. We remark that by the term resources we denote the amount of space, time, and energy employed by the machine to find the solution of a specific problem.

Digital Memcomputing Machines

The DMMs memprocessors (processors with memory) have only a finite number of possible states after the transition functions, $\delta$s, have been applied. The transition functions can be implemented using, e.g., circuits or some other physical mechanism, or can be emulated via code run on a machine to form a virtual circuit. The important characteristic is that they map $\mathbb{Z}_2^n$ into $\mathbb{Z}_2^m$, with n and m arbitrary integers.

A. Formal Definition

We recall that the UMM is an ideal machine formed by a bank of m interconnected memory cells—memprocessors—with $m \leq \infty$. This is represented in FIGS. 1A and 1B that respectively show test and solution modes of the UMM. Its DMM subclass performs digital (logic) operations controlled by a control unit. The computation with and in memory can be sketched in the following way. When two or more memprocessors are connected, through a signal sent by the control unit, the memprocessors change their internal states according to both their initial states and the signal, thus giving rise to intrinsic parallelism (interacting memory cells simultaneously and collectively change their states when performing computation) and functional polymorphism (depending on the applied signals, the same interacting memory cells can calculate different functions). [F. L. Traversa and M. Di Ventra, "Universal memcomputing machines," IEEE Trans. Neural Netw. Learn. Syst., 2015].

Definition III.1 A DMM is the eight-tuple $$\mathrm{DMM} = (\mathbb{Z}_2, \Delta, P, S, \Sigma, p_0, s_0, F) \quad (1)$$

Without loss of generality, we restrict the range to $\mathbb{Z}_2 = \{0, 1\}$ because the generalization to any finite number of states is trivial and does not add any major change to the theory. $\Delta$ is a set of functions.

$$\delta_\alpha : \mathbb{Z}_2^{m_\alpha} \setminus F \times P \to \mathbb{Z}_2^{m'_\alpha} \times P^2 \times S, \quad (2)$$

where $m_\alpha < 1$ is the number of memprocessors used as input of (read by) the function $\delta_\alpha$, and $m_\alpha' < \infty$ is the number of memprocessors used as output (written by) the function $\delta_\alpha$; P is the set of the arrays of pointers $p_\alpha$ that select the memprocessors called by $\delta_\alpha$ and S is the set of indexes $\alpha$; $\Sigma$ is the set of the initial states written by the input device on the computational memory; $p_0 \in P$ is the initial array of pointers; $s_0$ is the initial index $\alpha$, and $F \subseteq \mathbb{Z}_2^{m_f}$ for some $m_f \in \mathbb{N}$ is the set of final states.

Computational Complexity Classes

We now use the notion of AB and CB problems introduced above to define the first two classes of computational complexity for a DMM. Artisans will recognize that the DMM can be used also as a standard Turing machine when implemented in DP. This implies an ability to design DMMs to implement problems in their AB formulation as well as designing other DMMs implementing problems in their CB formulation.

Definition III.2 A CB problem is said to be Polynomially Compact for a DMM ($PC_M$) if, for a given $\in \mathbb{Z}_2^n$, to verify if y satisfies $f(y)=b$ both the DMM implementing $f(y)$ and the DMM implementing the CF from the AB formulation of the problem, require polynomial resources in n.

Definition III.3 a CB problem is said to be Non-Polynomially Compact for a DMM ($NPC_M$) if, for a given $y \in \mathbb{Z}_2^n$, to verify if y satisfies $f(y)=b$ the DMM implementing $f(y)$ requires more than polynomial resources in n while the DMM implementing the CF from the AB formulation of the problem requires only polynomial resources.

We can further define other three computational complexity classes based on the complexity of the DP and IP.

Definition III.4 A CB problem is said to be Polynomially Invertible for a DMM ($PI_M$), if, to find a solution y of $f(y)=b$ with both the DP and the IP requires polynomial resources in $n = \dim(y)$.

On the other hand,

Definition III.5 A CB problem is said to be Memcomputing Polynomially Invertible for a DMM ($MPI_M$), if, to find a solution y of $f(y)=b$ with a DP requires more than polynomial resources in n, while the IP requires only polynomial resources.

On the contrary,

Definition III.6 a CB problem is said to be Non-Polynomially Invertible for a DMM ($NPI_M$), if, to find a solution y of $f(y)=b$ with both the DP and the IP requires more than polynomial resources in $n = \dim(y)$.

Finally, we remark that the case in which the IP requires more than polynomial resources while the DP only polynomial resources belongs to $NPCI_M$, and the case in which both require more than polynomial resources belongs to $CB \backslash PC_M$. However, both instances are not of interest to the present work. Therefore, we do not define them here.

The Euler diagram of the complexity classes for DMMs is shown in FIG. 2. FIG. 2 is a Euler diagram of computational complexity classes with respect to digital memcomputing machines. Of all problems AB=Algorithmic Boolean, the subclass CB=Compact Boolean can be solved in time $PC_M$=Polynomially Compact, $NPC_M$=Non-Polynomially Compact, $PI_M$=Polynomially Invertible, $MPI_M$=Memcomputing Polynomially Invertible, $NPI_M$=Non-Polynomially Invertible. Note that $NPC_M$=$PI_M \cup MPI_M \cup NPI_M$.

Topological Implementation of IP within DMMs

A DMM can be designed either to implement the DP or the IP. We discuss only the implementation of the latter case since the implementation of the DP is the same as for Turing machines so it does not add anything new.

We focus on a given CB problem characterized by the Boolean system $f$. Since $f$ is composed of Boolean functions, we can map $f$ into a Boolean circuit composed of logic gates. Then, implementing $f$ into a DMM can be formally done by mapping the Boolean circuit into the connections of the memprocessors. The DMM can then work in two different modes as shown in FIGS. 1A and 1B, specifically the test mode and the solution mode. The DMM includes a plurality of memprocessors 10 and a control unit 14. The control unit 14 maps the topology of connections from an input state to an output state. The memprocessors 10 are two-state interconnected elements that change their state according to both the external signal fed by the Control Unit 14 and the signals from the other memprocessors through their connections. $\delta$ is the composition of all transition functions involved in the computation. FIG. 1A shows the test mode for the verification of a given solution of a CB problem, while FIG. 1B shows the solution mode for the IP implementation In the test mode (FIG. 1A) a control unit 14 feeds appropriate memprocessors 10 with a signal encoding y. In this way, the first transition function $\delta_\alpha$ receives its input. Performing the composition of all transition functions, $(\delta_\zeta \circ \ldots \circ \delta_\alpha)(y)$, we obtain the output $f(y)$ to be compared against b to determine whether or not y is a solution of the CB problem. In this case, the transition function $\delta = \delta_\zeta \circ \ldots \circ \delta_\alpha$ represents the encoding of $f$ through the topology of the connections of the memprocessors.

In the solution mode (FIG. 1B) the control unit feeds the appropriate memprocessors with a signal encoding b. The first transition function $\delta_\alpha^{-1}$ receives its input, and the composition of all transitions functions, $(\delta_\zeta^{-1} \circ \ldots \circ \delta_\alpha^{-1})(b)$, produces the output y.

The transition function $\delta^{-1} = \delta_\zeta^{-1} \circ \ldots \circ \delta_\alpha^{-1}$ still represents the encoding of $f$ through the topology of the connections of the memprocessors. However, it works as some system g such that g(b)=y. Note that g is not strictly the inverse of $f$ because it may not exist as a Boolean system. For this reason we call g the topological inverse of $f$ and $\delta^{-1}$ inverse transition function of $\delta$.

The DMM works by encoding a Boolean system $f$ onto the topology of the connections. This means that to solve a given problem with a given input length we utilize a given DMM formed by a number of memprocessors and topology of connections directly related to $f$ and the input length.

Furthermore, we notice that the possibility of implementing the IP to solve a CB problem into a DMM is ultimately related to its intrinsic parallelism. Finally, even if the realization if such particular DMM is not unique (there may be different types of memprocessors and topologies that solve such a problem) it is, however, a special purpose machine designed to solve a specific problem.

Conversely, the Turing machine is a general purpose machine in the sense that to solve a given problem we have to provide a set of instructions to be computed. In other words, the Turing machine can only solve problems employing the DP. It is also worth remarking that DMMs are more than standard neural networks (even if a neural network is a special case of DMMs). In fact, artificial neural networks do not fully map the problems into the connectivity of neurons. On the contrary, they are in some measure "general purpose" machines that need to be trained to solve a given problem. The DMM transfers the network training step into the choice of network topology.

We also note that cryptographic schemes can be solved with the present DMMs. NP problems such as factorization or the subset-sum problem, can be efficiently solved with DMMs implementing the IP. This means that the standard cryptosystems like the RSA or others based on the notion of one-way functions, can be broken by DMM s. For example, the SHA (cryptographic hash function) for the digest/hash is not proved to be NP but it is, at the state of the art, a one way function. DMM can also efficiently solve such one way functions. Preferred embodiments also provide new cryptosystems beyond the Turing machine paradigm. As a guideline, we notice here that a cryptosystem for DMMs should be based on problems belonging either to the class $NPI_M$ or $NPC_M$ that have both the DP and IP scaling more than polynomial in the length of the input. However, the class of the $NPI_M$ problems could be empty if all the $PCI_M$ problems can be solved in polynomial time by the DMM employing the IP. In this case, we should instead focus on $NPC_M$ problems.

Information Overhead

Using the definition given in the previous sections, we can now formally define a concept: the information overhead. We first stress that this information is not stored in any memory unit. The stored information is the Shannon self-information that is equal for both Turing machines and UMMs. Instead, it represents the extra information that is embedded into the topology of the connections of the DMMs. Thus we have:

Definition III.7 The information overhead is the ratio $$I_O = \frac{\sum_i (m_{\alpha_i}^U + m'^U_{\alpha_i})}{\sum_j (m_{\alpha_j}^T + m'^T_{\alpha_j})}; \quad (3)$$

where $m_{\alpha_j}^T$ and $m'^T_{\alpha_j}$ are the number of memprocessors read and written by the transition function $\delta_{\alpha_j}^T$ that is the transition function of a DMM formed by interconnected memprocessors with topology of connections related to the CB problem, while $m_{\alpha_j}^U$ and $m'^U_{\alpha_j}$ are the number of memprocessors read and written by the transition function $\delta_{\alpha_j}^U$ that is the transition function of a DMM formed by the union of non-connected memprocessors. The sums run over all the transition functions used to find the solution of the problem.

From this definition, one can use the $\delta_{\alpha_n}^T = \delta_{\alpha_i}^{-1}$ defined above. Conversely, since $\delta_{\alpha_j}^U$ is the transition function of non-connected memprocessors the unique way to find a solution is by employing the DP. Therefore, problems belonging to the class $MPI_M$ have information overhead that is more than polynomial, i.e., the topology encodes or "compresses" much more information about the problem than the DP. It is worth noticing again that this information is something related to the problem, i.e., related to the structure of $f$ (topology of the memprocessor network), and not some actual data stored by the machine. Finally, due to its different nature, the information overhead that we have defined does not satisfy the standard mathematical properties of information measures. Instead, it provides a practical measure of the importance of the topology in a given computing network.

Dynamical Systems Picture

In order to provide a practical, physical route to implement DMMs, we now reformulate them in terms of dynamical systems. This formulation will also be useful for a formal definition of accessible information and information overhead and at the same time to clearly point out their scalability and main differences with the most common definitions of parallel Turing machines.

Dynamical Systems Formulation of DMM.

We consider the transition function $\delta_\alpha$ defined in (2) and $p_\alpha, p'_\alpha \in P$ being the arrays of pointers $p_\alpha = \{i_1, \ldots i_{m_\alpha}\}$ and $p'_\alpha = \{j_1, \ldots j_{m'_\alpha}\}$. Furthermore, we describe the state of the DMM (i.e., the state of the network of memprocessors) using the vector $x \in \mathbb{Z}_2^n$. Therefore, $x_{p_\alpha} \in \mathbb{Z}_2^{m_\alpha}$ is the vector of states of the memprocessors selected by $p_\alpha$. Then, the transition function $\delta_\alpha$ acts as $$\delta_\alpha(x_{p_\alpha}) = x_{p'_\alpha} \qquad (4)$$

In other words, $\delta_\alpha$ reads the states $x_{p_\alpha}$ and writes the new states $x'_{p'_\alpha}$. Equation (4) points out that the transition function $\delta_\alpha$ simultaneously acts on a set of memprocessors (intrinsic parallelism).

The intrinsic parallelism of these machines is the feature that is at the core of their power. It is then very important to understand its mechanism and what derives from it. To analyze it more in depth, we define the time interval $\mathcal{J}_\alpha = [t, t+T_\alpha]$ that $\delta_\alpha$ takes to perform the transition. We can describe mathematically the dynamics during $\mathcal{J}_\alpha$ by making use of the dynamical systems framework [See, L. Perko, Differential equations and dynamical systems, vol. 7. Springer, Science & Business Media, 3nd ed., 2001]. At the instant t the control unit sends a signal to the computational memory whose state is described by the vector x(t)

The dynamics of the DMM within the interval $\mathcal{J}_\alpha$, between two signals sent by the control unit is described by the flow $\phi$ (the definition of flow follows from the dynamical systems formalism [See, L. Perko, Differential equations and dynamical systems, vol. 7. Springer, Science & Business Media, 3nd ed., 2001])

$$x(t' \in \mathcal{J}_{j_\alpha}) = \phi_{t'-t}(x(0), \qquad (5)$$

namely all memprocessors interact at each instant of time in the interval $I_\alpha$ such that $$x_{p_\alpha}(t) = x_{p_\alpha} \qquad (6)$$

$$x_{p'_\alpha}(t+T_\alpha) = x'_{p'_\alpha} \qquad (7)$$

Parallel Turing Machines

Parallelism in standard computing machines can be viewed from two perspectives: the practical and the theoretical one. The theoretical approach is still not well assessed and there are different attempts to give a formal definition of parallel Turing Machines (PTMs). Irrespective, the PTM often results in an ideal machine that cannot be practically built. Therefore, we are more interested in a description of the practical approach to parallelism.

The definition we give here includes some classes of PTMs, in particular the Cellular Automata and non-exponentially growing Parallel Random Access Machines. We consider a fixed number of (or at most a polynomially increasing number of) central processing units (CPUs) that perform some tasks in parallel. In this case each CPU can work with its own memory cash or accesses a shared memory depending on the architecture. In any case, in practical Parallel Machines (PM), all CPUs are synchronized, and each of them performs a task in a time $T_{PM}$ (the synchronized clock of the system of CPUs), and at the end of the clock cycle all CPUs share their results and follow with the subsequent task. We can describe mathematically also this picture within the dynamical system framework [See, L. Perko, Differential equations and dynamical systems, vol. 7. Springer, Science & Business Media, 3nd ed., 2001] to point out the difference with the intrinsic parallelism of memcomputing.

Let us consider the vector functions $s(t) = [s_1(t), \ldots, s_{n_s}(t)]$ and $k(t) = [k_1(t), \ldots, k_{n_k}(t)]$ defining respectively the states of the $n_s$ CPUs and the symbols written on the total memory formed by $n_k$ memory units. As long as the CPUs perform their computation, at each clock cycle they act independently so there are $n_s$ independent flows describing the dynamics during the computation of the form $(s_j(t+T_{PM}), k_{j_w}(t+T_{PM})) = \phi_{T_{PM}}^j(s_j(t), k(t))$, where $k_{j_w}$ is the memory unit written by the j-th CPU. Since the j-th CPU just reads the memory k(t) at only the time t and not during the interval $\mathcal{J}_{PM} = ]t, t+T_{PM}]$, and it does not perform any change on it apart from the unit $k_{j_w}$, the evolution of the entire state during $I_{PM}$ is completely determined by the set of independent equations $$(s_j(t' \in \mathcal{J}_{PM}), m_{j_w}(t' \in \mathcal{J}_{PM}) = \phi_{t'-t}^j(s_j(t), k(t)). \qquad (8)$$

A quick comparison with Eq. 5 shows the fundamental difference with memcomputing machines: in each interval $\mathcal{J}_{PM}$ the $n_s$ CPUs do not interact in any way and their dynamics are independent.

Accessible Information

Let us now consider a DMM and a PTM having the same number, m, of memprocessors, and standard processors, respectively, and taking the same time T to perform a step of computation. Moreover, we can also assume that at time t and t+T, the computing machines (whether DMM or PTM) have the state of the memory units that can be either 0 or 1. Therefore, the number of all possible initial or final configurations of both the DMM and PTM is $2^m$, and the Shannon self-information is equal for both, namely $I_S = -\log_2[2^{-m}] = m$.

Definition IV.1 The accessible information $I_A$ is the volume of the configuration space explored by the machine during the computation, i.e., during the interval $\mathcal{J}_T$.

We remark that the concept and definition of accessible information (and also of information overhead given above), even if it follows from principles of statistical mechanics, it is not the standard information measure in the sense that it does not satisfy the usual properties of the information measures. On the other hand, our definition is able to highlight relevant features useful to point out differences between DMMs (or UMMs in general) and Turing machines.

Information Overhead Vs. Accessible Information

We have introduced the concept of information overhead in [F. L. Traversa and M. Di Ventra, "Universal memcomputing machines," IEEE Trans. Neural Netw. Learn. Syst., 2015] and formalized it above. We next discuss its relationship with the accessible information making use of the dynamical systems picture.

As described above, the DMMs can access, at each computational step, a configuration space that may grow exponentially. Therefore, a DMM, even if it starts from a well defined configuration and ends in another well-defined configuration both belonging to $\mathbb{Z}_2^m$, during the computation its collective state (i.e., the state of the memprocessor network) results in a superposition of all configurations allowed by the DMM.

We consider a unit proportionality coefficient between the volume of the configuration space explored by the machine and the accessible information. Now, the accessible information is always larger or equal to the number of memprocessors involved in the computational step. In fact, we have $2m \leq I_A \leq 2^m$ and $(m_\alpha + m_\alpha') \leq 2m \leq I_A$.

Therefore, using equation (3), we have $$I_O \leq \frac{\sum_i I_{A_i}^U}{\sum_j (m_{\alpha_j}^T + m_{\alpha_j}'^T)}, \quad (9)$$

where $I_{A_i}^U$ the accessible information of the computational step i of a DMM formed by a union of non-connected memprocessors.

We can further notice that $I_{A_i}^U = 2m_i^U \geq (m_{\alpha_i}^U + m_{\alpha_i}'^U)$ where $m_i^U$ is the total number of memprocessors involved in the computational step i. Conversely, the accessible information of the computational step j of a DMM formed by interconnected memprocessors is $I_{A_j}^T = 2^{m_j}$.

Now, we consider a CB problem belonging to PCM with $n = \dim(y)$ and $f$ the associated Boolean system. By the definitions above, the number of memprocessors involved in the computation (either in test or solution mode) is a polynomial function of n. Moreover, the number of steps to solve a problem in $MPI_M$ is polynomial for the case of IP (namely when interconnected memprocessors encode $f$ into the topology of the connections) while it could be more than polynomial in the case of DP (for examples, the union of unconnected memprocessors). Then, there exist two positive polynomial functions P(n) and Q(n) such that $P(n)\Sigma_i I_{A_i}^U = Q(n)\Sigma_j I_{A_j}^T$. We can substitute this relation into Eq. (9) and have (since all quantities are related to the same machine we can suppress the superscript T):

$$I_O \leq \frac{Q \sum_j I_{A_j}}{P \sum_j (m_{\alpha_j} + m_{\alpha_j}')} \quad (10)$$

It is worth noticing that the relation (10) is valid for any type of topology, including the one with no connections. In fact, in the case of no connections and computational steps that involve all memprocessors (which is equivalent to a PTM) we have that $P = Q$, $I_{A_j} = 2m_{Aj}$; $= (m_{\alpha_j} + m_{\alpha_j}')$ and $I_O \leq 1$, namely, no information has been encoded (compressed) into the topology of the machine. The other limit case is that of connections not related to the problem (like in neural networks). In this case, at least one of P or Q cannot be polynomial but the ratio P/Q must be more than polynomial in n and the $I_O$ is maximized by a polynomial function of n.

Equilibrium points and IP. The information overhead and accessible information de-fined in the previous section can be interpreted as operational measures of the computing power of a DMM. However, another important feature to characterize the computing power of these machines is the composition of its phase space, i.e., the n-dimensional space in which x(t) is a trajectory (not to be confused with the configuration space). In fact, the extra information embedded into a DMM by encoding $f$ onto the connection topology strongly affects the dynamics of the DMM, and in particular its global phase portrait, namely the phase space and its regions like attraction basins, separatrix, etc.

To link all these concepts, the dynamical system describing a DMM should have the following properties:

Each component $x_j(t)$ of x(t) has initial conditions $x_j(0) \in X$, where X is the phase space and also a metric space.

To each configuration belonging to $\mathbb{Z}_2^m$, one or more equilibrium points $x_s \in X$ can be associated, and the system converges exponentially fast to these equilibria.

The stable equilibria $x_s \in X$ are associated to the solutions of the CB problem.

To consistently define the DMM as a digital machine, the input and output of the DMM (namely y and b in test mode or b and y in solution mode) must be mapped into a set of parameters $p = \{p_j\}$ (input) and equilibria $x_s = \{x_{s_j}\}$ (output) such that $\exists \hat{p}_0, \hat{p}_1, \hat{p}, \hat{x}_0, \hat{x}_1 \in \mathbb{R}$ (that encode logical 0 and 1) and $|p_j - \hat{p}_0| + |p_j - \hat{p}_1| = c_p$ and $|x_{s_j} - \hat{x}_0| + |x_{s_j} - \hat{x}_1| = c_x$ for some $c_p$, $c_x > 0$ independent of $n = \dim(y)$ and $n_b = \dim(b)$. Moreover, if we indicate a polynomial function of n of maximum degree $\gamma$, with $p_\gamma(n)$, then $\dim(p) = p_{\gamma_p}(n)$ and $\dim(x_s) = p_{\gamma_x}(n_b)$ in test mode or $\dim(p) = p_{\gamma_p}(n_b)$ and $\dim(x_s) = p_{\gamma_x}(n)$ in solution mode, with $\gamma_x$ and $\gamma_p$ independent of $n_b$ and n.

Other stable equilibria, periodic orbits or strange attractors that we generally indicate with $x_w(t) \in X$, not associated with the solution(s) of the problem, may exist, but their presence is either irrelevant or can be accounted for with appropriate initial conditions.

The system has a compact global asymptotically stable attractor [J. Hale, Asymptotic Behavior of Dissipative Systems, vol. 25 of Mathematical Surveys and Monographs, Providence, R.I., American Mathematical Society, 2d Edition 2010], which means that it exists a compact $J \subset X$ that attracts the whole space X.

The system converges to equilibrium points exponentially fast starting from a region of the phase space whose measure is not zero, and which can decrease at most polynomially with the size of the system. Moreover, the convergence time can increase at most polynomially with the input size.

It is worth noticing that the last requirements are satisfied if the phase space is completely clustered in regions that are the attraction basins of the equilibrium points and, possibly, periodic orbits and strange attractors, if they exist. We also point out that a class of systems that has a global attractor is the one of dissipative dynamical systems [J. Hale, Asymptotic Behavior of Dissipative Systems, vol. 25 of Mathematical Surveys and Monographs, Providence, R.I., American Mathematical Society, 2d Edition 2010]. By "dissipative" we do not necessarily mean "passive": active systems can be dissipative as well in the functional analysis sense [J. Hale, Asymptotic Behavior of Dissipative Systems, vol. 25 of Mathematical Surveys and Monographs, Providence, R.I., American Mathematical Society, 2d Edition 2010]. The examples we provide satisfy these properties with the added benefit that the only equilibrium points are the solutions of the problem.

We further define $V = \text{vol}(X)$ the hyper-volume of V defined by some Lebesgue measure on X, $J_S \subseteq J$ the compact subset of the global attractor J containing all equilibria $x_S$ only and $J_w \subseteq J$ compact subset of the global attractor J containing all $x_w(t)$ only.

Therefore, we have $J = J_S \cup J_w$ and $J_S \cap J_w = 0$. We also define the sub-hyper volumes $V_S = \text{vol}(X_S)$ where $X_S \subseteq X$ the subset of X attracted by $J_S$. Similarly, we have sub-hyper volumes $V_w = \text{vol}(X_w)$ where $X_w \subseteq X$ is the subset of J attracted by $J_w$. By definition of attractors, $J_S$ and $J_w$, we have that $X_S \cap X_w = 0$ and since $J$ is a global attractor $$V = V_S + V_w. \quad (11)$$

Using these quantities, we can define both the probabilities that the DMM finds a solution of a CB using the IP, or that it fails to find it as $$P_S = \frac{V_S}{V}, P_w = \frac{V_w}{V}, \quad (12)$$

respectively.

Clearly, this analysis refers to a DMM that finds a solution y of a CB problem only in one step. In this case we say that the DMM works properly if $P_S > p_\gamma^{-1}(n)$ for some $\gamma \in \mathbb{N}$.

On the other hand, we can have IPs that require several computational steps to find the solution. In this case, after each step of computation the control unit can add some extra input depending on the $x_w$. Therefore, we can define the sequence of probabilities of succeeding or failing as $$P_S^1 = \frac{V_S^1}{V}, \quad P_w^1 = \frac{V_w^1}{V} \quad (13)$$
$$P_S^h = \frac{V_S^h}{V}, \quad P_w^h = \frac{V_w^h}{V},$$

If the number of steps, h, required to find the solution is a polynomial function of n such that $P_z^h > p_\gamma^{-1}(n)$, we then say that the DMM works properly, or more precisely it has found the solution of the given CB problem in $MPI_M$ with polynomial resources in n.

Self-Organizing Logic Gates

We have given the main definitions and properties characterizing DMMs as a mathematical entity above. Within the theory of dynamical systems, we have related them to possible physical systems that perform computation using the IP. We can then conclude that there is no mathematical limitation in presupposing the existence of a system with the properties of a DMM. A physical system that satisfies all requirements of the DMM defined mathematically is now provided in the form of a new type of logic gate that can assembled in a circuits.

Figure 3B:
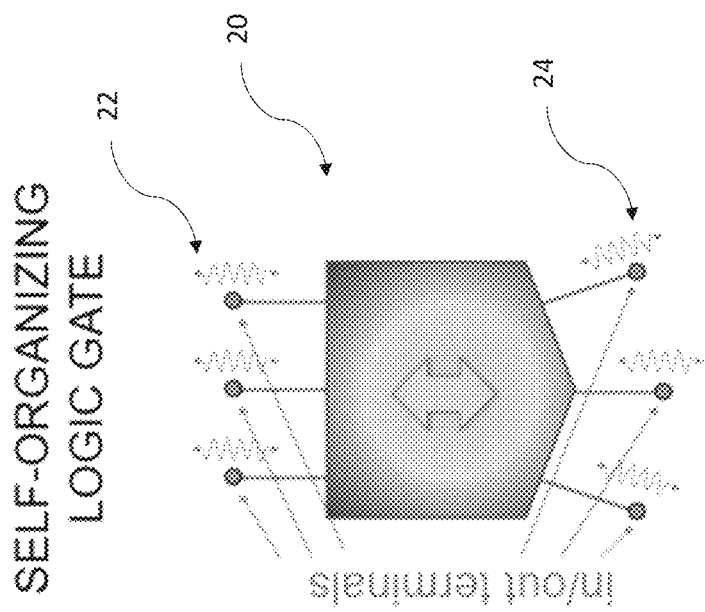
FIG. 3B is a diagram of a self-organizing n-terminal logic gate (SOLG) of the invention that can use any terminal simultaneously as input or output.
Figure 3A:
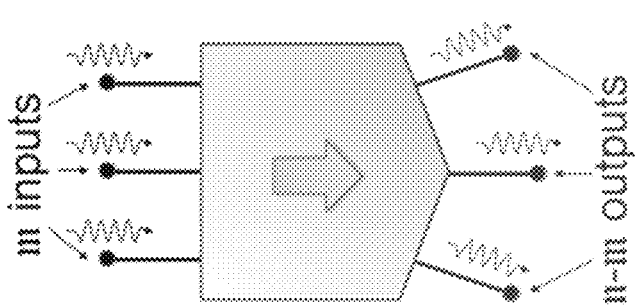
FIG. 3A (prior art) is a diagram of a standard n-terminal logic gate with m inputs and n-m outputs.

FIG. 3A illustrates a conventional logic gate. The gate includes input terminals that receive input signals, the gate processes the inputs, and finally sends to the output terminals the result of the computation. This is a sequential logic gate that is limited to sequential operations.

FIG. 3B provides a self-organizing logic gate 20 (SOLG) of the invention. The SOLG 20 includes a first set of in/out terminals 22 and a second set of in/out terminals 24.

The SOLG logic gates 20 instead provide all logic functions such as AND, OR, XOR, NOT, NOR, NAND and any other one in such a way that they work as standard gates by varying the input (at first in/out gates 22) and obtaining the output (at second in/out gates 24), while also operating "in reverse", by varying the output, they dynamically provide an input consistent with that output. In general, these gates are objects having properties allowing them to be designated as self-organizing logic gates (SOLGs).

The SOLG 20 can use any terminal from the first set 22 and the second set 24 simultaneously as input or output, i.e., signals can go in and out at the same time at any terminal resulting in a superposition of input and output signals. The gate changes dynamically the outgoing components of the signals depending on the incoming components according to some rules aimed at satisfying the logic relations of the gate.

FIGS. 4A-4C show that an example self-organizing AND gate can have either stable configurations (left panel) or unstable (right panel) configurations. In the former case, the configuration of the signals at the terminals satisfies the logic relation required (in the case of FIG. 4B, the logic AND relation) and the signals would then remain constant in time. Conversely, if the signals at a given time do not satisfy the logic relation, we have the unstable configuration: the SOLG drives the outgoing components of the signal to finally obtain a stable configuration. Table 1 below provides states for SOLGs with two terminals as a first set 22 and one terminal as a second set 24. Three separate logic functions are provided that correspond to AND, OR and XOR when two inputs are applied to terminals 22 to obtain the respective ordinary function at the terminal 24. Table 1 also specifies states necessary to achieve SOLG operation.

TABLE 1

UNIVERSAL SO GATE PARAMETERS

| | Terminal 1 | | | | Terminal 2 | | | | Out Terminal | | | |
|---|---|---|---|---|---|---|---|---|---|---|---|---|
| | $a_1$ | $a_2$ | $a_o$ | dc | $a_1$ | $a_2$ | $a_o$ | dc | $a_1$ | $a_2$ | $a_o$ | dc |
| SO AND | | | | | | | | | | | | |
| $L_{M1}$ | 0 | −1 | 1 | $v_c$ | −1 | 0 | 1 | $v_c$ | 1 | 0 | 0 | 0 |
| $L_{M2}$ | 1 | 0 | 0 | 0 | 0 | 1 | 0 | 0 | 0 | 1 | 0 | 0 |
| $L_{M3}$ | 0 | 0 | 1 | 0 | 0 | 0 | 1 | 0 | 0 | 0 | 1 | 0 |
| $L_{M4}$ | 1 | 0 | 0 | 0 | 0 | 1 | 0 | 0 | 2 | 2 | −1 | $-2v_c$ |
| $L_R$ | 4 | 1 | −3 | $-v_c$ | 1 | 4 | −3 | $-v_c$ | −4 | −4 | 7 | $2v_c$ |
| SO OR | | | | | | | | | | | | |
| $L_{M1}$ | 0 | 0 | 1 | 0 | 0 | 0 | 1 | 0 | 0 | 0 | 1 | 0 |
| $L_{M2}$ | 1 | 0 | 0 | 0 | 0 | 1 | 0 | 0 | 2 | 2 | −1 | $2v_c$ |
| $L_{M3}$ | 0 | −1 | 1 | $-v_c$ | −1 | 0 | 1 | $-v_c$ | 1 | 0 | 0 | 0 |
| $L_{M4}$ | 1 | 0 | 0 | 0 | 0 | 1 | 0 | 0 | 0 | 1 | 0 | 0 |
| $L_R$ | 4 | 1 | −3 | $v_c$ | 1 | 4 | −3 | $v_c$ | −4 | −4 | 7 | $-2v_c$ |
| SO XOR | | | | | | | | | | | | |
| $L_{M1}$ | 0 | −1 | −1 | $v_c$ | −1 | 0 | −1 | $v_c$ | −1 | −1 | 0 | $v_c$ |
| $L_{M2}$ | 0 | 1 | 1 | $v_c$ | 1 | 0 | 1 | $v_c$ | 1 | 1 | 0 | $v_c$ |
| $L_{M3}$ | 0 | −1 | 1 | $-v_c$ | −1 | 0 | 1 | $-v_c$ | −1 | 1 | 0 | $-v_c$ |
| $L_{M4}$ | 0 | 1 | −1 | $-v_c$ | 1 | 0 | −1 | $-v_c$ | 1 | −1 | 0 | $-v_c$ |
| $L_R$ | 6 | 0 | −1 | 0 | 0 | 6 | −1 | 0 | −1 | −1 | 7 | 0 |

Figure 5:
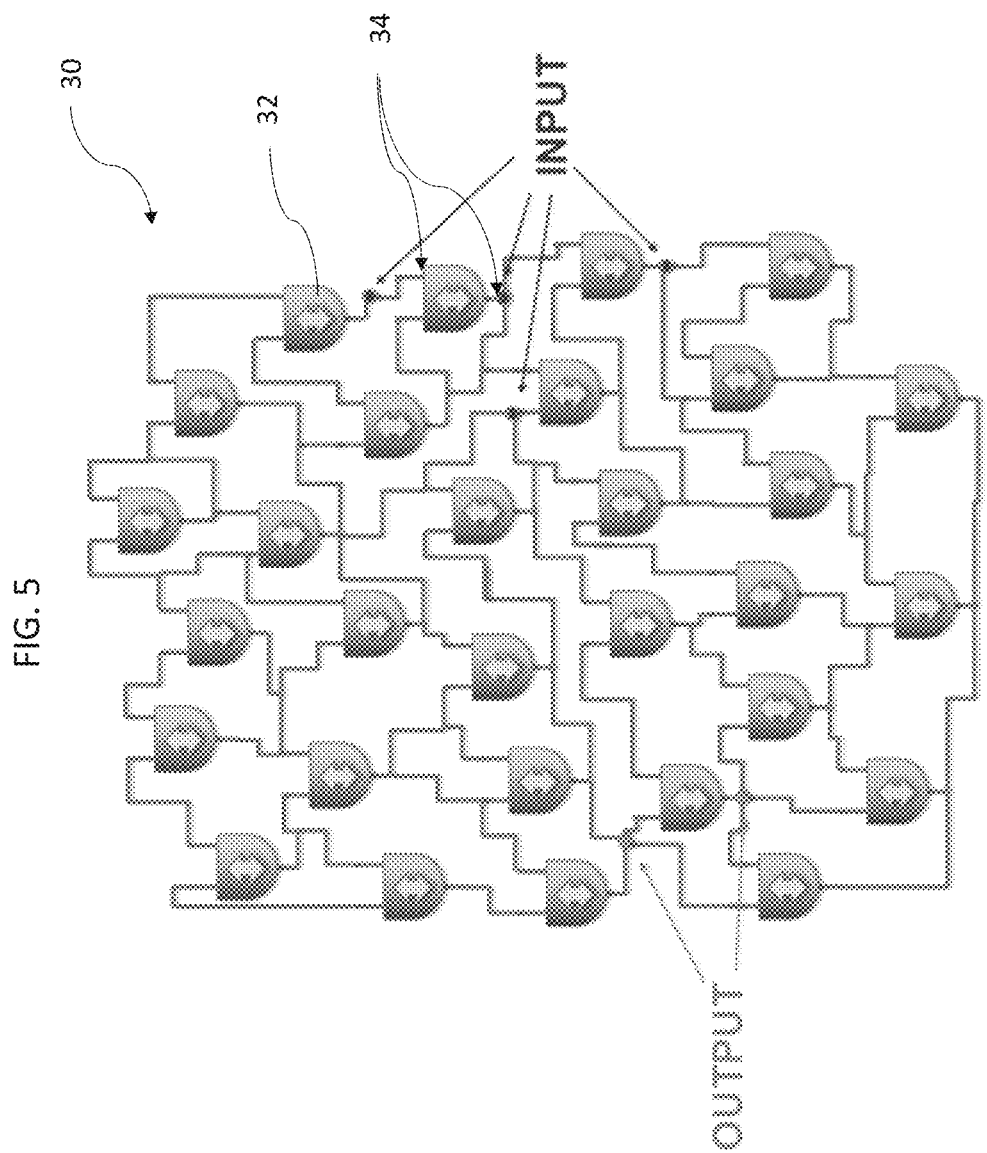
FIG. 5 is a diagram of a Self-Organizing Logic Circuit (SOLC) formed by a network of SO-AND gates.

Circuits are formed by combining SOLG gates. FIG. 5 shows a Self-Organizing Logic Circuit (SOLC) 30 formed by a network of SO-AND gates 32. At each node 34 of a SOLG within the circuit 30, an external input signal can be provided and the output can be read at other nodes of the SOLC. The external inputs are sent to some nodes related to the computational task at hand. The self-organizing circuit 30 organizes itself by finding a stable configuration that satisfies the logic proposition and then the solution is read at the output nodes, i.e., the nodes that encodes the solution of the given problem. The connections of the circuit are related to a specific computational task required by the circuit. The topology of the connections and the specific logic gates used are not necessarily unique and can be derived from standard Boolean logic circuit theory, meaning that for a given CB problem, mapping $f$ into the connections can be done by using standard Boolean relations. In this way the SOLC 30 represents a DMM that can work in either of the test or solution mode of FIGS. 1A and 1B.

Examples of Electronic-Based SOLGs

The SOLGs can be realized in practice using available electronic devices. FIG. 6A shows a universal SO gate 40 that, by changing internal parameters, can work as AND, OR or XOR SO gates. It is universal because using AND and XOR, or OR and XOR we have a complete Boolean basis set. The universal gate 40 of FIG. 6A provides logical 0 and 1 that are encoded into the potentials $v_1$, $v_2$ and $v_0$ at a first set of in/out terminals 42 and a second set of in/out terminals 44 (in this example one). For example, we can choose a reference voltage $v_c$ such that terminals with voltage $v_c$ encode the logic 1s and terminals with voltage $-v_c$ encode logic 0s. The basic circuit elements are resistors, memristors (resistors with memory) 42 and voltage controlled voltage generators 44. The gate 40 includes two memristors 46 and a dynamic correction module 48 applied to each terminal. FIG. 6B shows the dynamic correction module 48 in detail. The memristors 46 have minimum and maximum resistances $R_{on}$ and $R_{off}$ respectively The memristors 46 are defined by the following relations $$v_M(t) = M(x) i_M(t) \quad (14)$$

$$C\dot{v}_M(t) = i_C(t) \quad (15)$$

$$\dot{x}_M = f_M(x, v_M) \text{voltage driven} \quad (16)$$

$$\dot{x}(t) = f_M(x, i_M) \text{current driven} \quad (17)$$

where x denotes the state variable(s) describing the internal state(s) of the system (from now on we assume for simplicity a single internal variable); $v_M$ and $i_M$ the voltage and current across the memristor. The function M is a monotonous positive function of x. The example embodiment uses the following relation:

$$M(x) = R_{on}(1-x) + R_{off} x, \quad (18)$$

which is a good approximation to describe the operation of a certain type of memristors. This model also includes a small capacitance C in parallel to the memristor that represents parasitic capacitive effects (Eq. (15)). $f_M$ is a monotonic function of $v_M(i_M)$ while $x \in [0, 1]$ and null otherwise. Any function that satisfies the monotonic condition and nullity for $x \notin [0, 1]$ would define a memristor. In alternate embodiments, the memristor functionality is replaced with an appropriate combination of transistors.

The voltage-controlled voltage generator (VCVG) is a linear voltage generator piloted by the voltages $v_1$, $v_2$ and $v_0$. The output voltage is given by $$v_{VCVG} = a_1 v_1 + a_2 v_2 + a_0 v_0 + dc, \quad (19)$$

and the parameters $a_1$, $a_2$ $a_0$ and dc are determined to satisfy a set of constraints characteristic of each gate (AND, OR or XOR) as reported in Table I. These constrains can be summarized in the following scheme:

if the gate is connected to a network and the gate configuration is correct, no current flows from any terminal (the gate is in stable equilibrium).

Otherwise, a current of the order of $v_c/R_{on}$ flows with sign opposite to the sign of the voltage at the terminal.

When we connect these gates together, these simple requirements induce feedback in the network forcing it to satisfy, all at once, all the gates since their correct configurations are stable equilibrium points. It is worth noticing that, since all elements but the voltage driven voltage generators are passive elements, the equilibrium points of the gates are stable and attractive.

A set of parameters that satisfies these requirements is given in table I for the three SO gates. Finally, we remark that the parameters in table I are not unique and their choice can strongly affect the dynamics of the network. In general, in order to guarantee the stability of the gates, the must satisfy the equation (28)

Auxiliary Circuitry for SOLCs

When we assemble a SOLC as in FIG. 5, using SOLGs of FIGS. 6A and 6B, we may not always prevent the existence of some stable solution not related to the problem. For instance, it can be shown that the dynamic correcting modules defined through table I admit in some configuration also zero voltage as stable value, namely neither $v_c$ nor $-v_c$. Indeed, if we impose at the output terminal of the SO-AND $v_0 = -v_c$ (meaning that we are imposing a logic 0 at the output of the SO-AND), a possible stable solution is $(v_1, v_2) = (0, 0)$ (Notice that the only acceptable solutions are $(-v_c, v_c)$, $(v_c, -v_c)$ and $(-v_c, -v_c)$.)

Figures 7A, 7B:
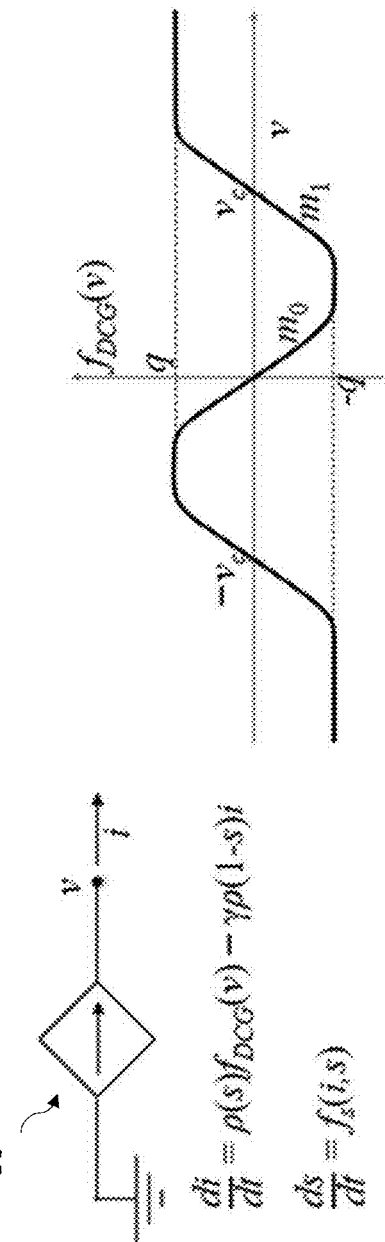
FIGS. 7A and 7B illustrate a voltage controlled differential current generator that is used in the SOLC of FIG. 5 to provide stability.

FIGS. 7A and 7B illustrate a Voltage-Controlled Differential Current Generator 50 and the equations of the Voltage-Controlled Differential Current Generator and its function $f_{DCG}$.

A voltage controlled generator is applied in the SOLC of FIG. 5 at each SOLG terminal except for terminals that receive inputs. The VCDCG 50 admits as unique stable solutions either $v = v_c$ or $v = -v_c$. Consider the simplified equation that governs the VCDCG $$\frac{di}{dt} = f_{DCG(v)} \quad (20)$$

where the function $f_{DCG}$ is sketched in FIG. 7. If we consider the voltage $v$ around 0, the Eq. (20) can be linearized and gives $$\frac{di}{dt} = -m_0 v \text{ with } m_0 = -\frac{\delta f_{DCG}}{\delta v}\bigg|_{v=0} > 0.$$

Therefore, it is equivalent to a negative inductor and it is sufficient to make the solution 0 unstable. On the other hand, if we linearize around $v = \pm v_c$ (the desired values) we obtain $$\frac{di}{dt} = m_1(v \mp v_c) \text{ with } m_1 = \frac{\delta f_{DCG}}{\delta v}\bigg|_{v = \pm v_c} > 0.$$

This case is equivalent to an inductor in series with a DC voltage generator of magnitude $\pm v_c$. Since it is connected to a circuit made of memristors and linear voltage generators, $v = \pm v_c$ are stable points. Any other voltage $v$ induces an increase or decrease of the current and, therefore, there are no other possible stable points.

Figure 8:
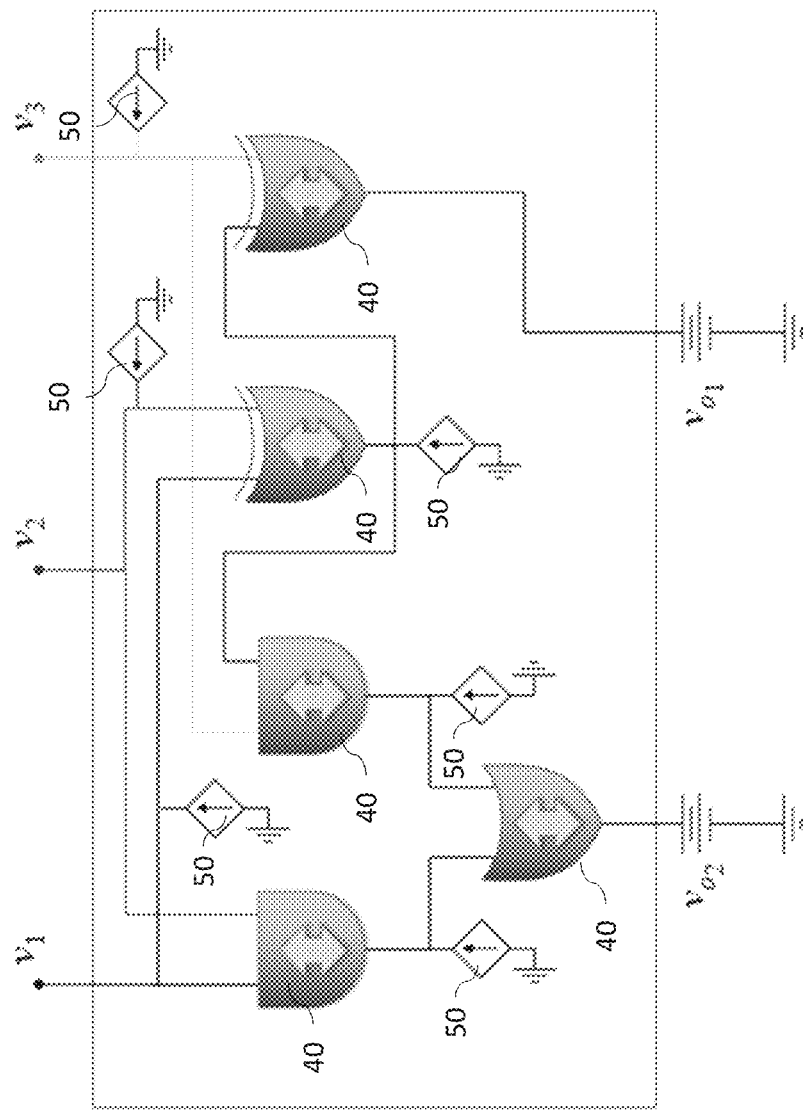
FIG. 8 illustrates the use of the FIGS. 7A and 7B voltage controlled differential current generator in an adder SOLC circuit operation.

FIG. 8 illustrates application of the VCDCG 50 in an SOLC that provides a SO three-bit adder. Every gate terminal that lacks an applied input connects to a VCDCG 50, while those receiving inputs do not. The input of the adder are the DC generators with voltage $v_{o_1}$ and $v_{o_2}$. The circuit self-organizes to give $v_1$, $v_2$ and $v_3$ consistent with $v_{o_1}$ and $v_{o_2}$.

Stability Analysis of SOLCS

SOLCs are asymptotically smooth, dissipative and as consequence they have a global attractor. All of the possible stable equilibria are related to the solution of the CB problem, and all the orbits converge exponentially fast to these equilibria irrespective of the initial conditions. This convergence rate depends at most polynomially with the size of the SOLC.

The SOLC dynamics is described by standard circuit equations. Using the modified nodal analysis, it has been shown that they form a differential algebraic system (DAS). However, dealing with ordinary differential equations (ODEs) is generally simpler from a theoretical point of view since it allows us to use several results of functional analysis as applied to dynamical systems theory. Of course, the results we obtain for the ODEs apply also to the particular DAS the ODEs originate from.

For this reason, we first perform an order reduction of our system, and after reducing the linear part we obtain an ODE. In doing so, the variables we need to describe our ODE are only the voltages $v_M \in \mathbb{R}^{n_M}$ across the memristors ($n_M$ is the number of memristors), the internal variables $x \in \mathbb{R}^{n_m}$ of the memristors, the currents $i_{DCG} \in \mathbb{R}^{n_{DCG}}$ flowing into the VCDCGs ($l_{DCG}$ the number of VCDCGs), and their internal variables $s \in \mathbb{R}^{n_{DCG}}$. The equations can be formally written as $$C\frac{d}{dt}v_M = (A_v + B_v \mathcal{D}[g(x)])v_M + A_i i_{DCG} + b, \quad (21)$$

$$\frac{d}{dt}x = \alpha \mathcal{D}[h(x, v_M)]\mathcal{D}[g(x)]v_M, \quad (22)$$

$$\frac{d}{dt}i_{DCG} = \mathcal{D}[\rho(s)]f_{DCG}(v_M) - \gamma \mathcal{D}[\rho(1-s)]i_{DCG}, \quad (23)$$

$$\frac{d}{dt}s = f_S(i_{DCG}, S), \quad (24)$$

where $\mathcal{D}$ is the linear operator $\mathcal{D}[\cdot]=\text{diag}[\cdot]$. In compact form it reads $$\frac{d}{dt}X = F(X), \quad (25)$$

where $x \equiv \{v_M, x, i_{DCG}, s\}$, and F can be read from the right-hand side (r.h.s.) of Eqs. (21)-(24). We discuss separately each one of them and we give the definitions of all parameters and functions in the following sections.

Equation (21)

In the Eq. (21) C is the parasitic capacitance of the memristors, $A_v$, $B_v \in \mathbb{R}^{n_M \times n_M}$ and $A_i \in \mathbb{R}^{n_M \times n_{DCG}}$ are constant matrices derived from the reduction of the circuit equations to the ODE format [K. Eshraghian, O. Kavehei, K.-R. Cho, J. Chappell, A. Iqbal, S. Al, Sarawi, and D. Abbott, "Memristive device fundamentals and modeling Applications to circuits and systems simulation," Proceedings of the IEEE, vol. 100, no. 6, pp. 1991-2007, 2012]. Finally, the vector function g: $\mathbb{R}^{n_M} \to \mathbb{R}^{n_M}$ is the conductance vector of the memristors defined through its components as (compare against Eq. (18))

$$g_j(x)=(R_1 x_j + R_{on})^{-1}, \quad (26)$$

with $R_1 = R_{off} - R_{on}$. We consider only the variable x restricted to $x \in [0,1]^{n_M} \subset \mathbb{R}^{n_M}$. In this case g: $[0,1]^{n_M} \to \mathbb{R}^{n_M}$ belongs to $C^\infty$ in the whole domain since $R_1$, $R_{on} > 0$.

The constant vector b is a linear transformation of the DC components of the voltage generators 50. Therefore, we have the following proposition:

Proposition VI.1 the Vector Function $$F_1(x) = C^{-1}(A_v + B_v \mathcal{D}[g(x)])v_M + C^{-1} A_i i_{DCG} + C^{-1}b, \quad (27)$$

on the r.h.s. of Eq. (21) defined on $x \in \mathbb{R}^{n_M} \times [0,1]^{n_M} \times \mathbb{R}^{2n_{DCG}}$ belongs to $C\infty(x)$. Moreover, since the system with no VCDGCGs (i.e., $i_{DCG}=0$) is passive the eigenvalues $\lambda_j(x)$ of the matrix $A_v + B_v \mathcal{D}[g(x)]$ satisfy $$\text{Re}(\lambda_j(x))<0) \text{ for } j=1, \ldots, n \text{ and } \forall x \in [0,1]^{n_M}, \quad (28)$$

Equation (22)

We first remark that the component j-th on the r.h.s. of Eq. (22) depends only on the variables $x_j$ and $v_{M_j}$ and we can write for $j=1, \ldots, n_M$ $$\frac{d}{dt}x_j = -\alpha h_j(x, v_M)g_j(x)v_{M_j} = -\alpha h(x_j, v_{M_j})g(x_j)v_{M_j}, \quad (29)$$

Therefore, without loss of generality, we can discuss Eq. (29) suppressing the index j in place of Eq. (22). The (29) is the equation for the current-driven memristors with $g(x) v_M$ the current flowing through the memristor. The case of voltage-driven does not add any extra content to our discussion and all models and results can be similarly derived for the voltage-driven case. The coefficient $\alpha>0$ can be linked to the physics of the memristors [M. Di Ventra and Y. V. Pershin, "On the physical properties of memristive, memcapacitive and meminductive systems, Nanotechnology, vol 24. p 255201, 2013]. The conductance g(x) is given by (26).

$$h(x, v_M)=\theta(x)\theta(v_M)+\theta(1-x)\theta(-v_M), \quad (30)$$

where $\theta$ is the Heaviside step function. However, this function does not belong to any class of continuity (like the majority of the alternative models) for the variables x and $v_M$. We then change it in a way that is physically consistent and it belongs to some class of continuity. In order to do this, we can write $$h(x, v_M)=(1-e^{-kx})\tilde{\theta}(v_M)+(1-e^{-k(1-x)})\tilde{\theta}(-v_M), \quad (31)$$

Before giving a complete description of the function $\tilde{\theta}$ we only require at the moment that $$\tilde{\theta}(y) = \begin{cases} > 0 & \text{for } y > 0 \\ 0 & \text{for } y \leq 0 \end{cases} \quad (32)$$

is a limit physically consistent) the function $-\alpha h(x, v_M)g(x) v_M$ can be linearized around $x=0$ and $x=1$ in the following way $$-\alpha h(x, v_M)g(x)v_M \big|_{x \approx 0} = \begin{cases} -\alpha k x \theta(v_M)g(0)|v_M| & \text{for } v_M > 0 \\ \alpha \tilde{\theta}(-v_M)g(0)|v_M| & \text{for } v_M \leq 0, \end{cases} \quad (33)$$

$$-\alpha h(x, v_M)g(x)v_M \big|_{x \approx 1} = \begin{cases} -\alpha \tilde{\theta}(v_M)g(1)|v_M| & \text{for } v_M > 0 \\ -\alpha k(x-1)\theta(-v_M)g(1)|v_M| & \text{for } v_M \leq 0. \end{cases} \quad (34)$$

From these expressions and using (29) the behavior of x(t) around either 0 or 1 can be evaluated and we have $$x(t)\big|_{x \approx 0} \approx \begin{cases} e^{-\alpha k \tilde{\theta}(v_M)g(0)|v_M|t} & \text{for } v_M > 0 \\ \alpha \tilde{\theta}(-v_M)g(0)|v_M|t & \text{for } v_M \leq 0, \end{cases} \quad (35)$$

-continued $$x(t)\Big|_{x\approx 1} \approx \begin{cases} 1 - \alpha\tilde{\theta}(v_M)g(1)|v_M|t & \text{for } v_M > 0 \\ 1 - e^{-\alpha k\tilde{\theta}(v_M)g(0)|v_M|t} & \text{for } v_M \leq 0, \end{cases} \quad (36)$$

This proves the following proposition:

Proposition VI.2 Using (31) to represent $h(x, v_M)$ then $h(x, v_M) \in C^\infty(x)$ and for any $x \in [0,1]^{n_M}$ and for any $t>0$, we have $\phi_t^x(x)$ is the flow of the dynamical system (25) restricted to the variable x only. Then $[0,1]^{n_M}$ is an invariant subset of $\mathbb{R}^{n_M}$ under $\phi_t^x$. Moreover, the boundary points 0 and 1 are limit points and for any open ball of $B \subset [0,1]^{n_M}$ we have that $\phi_t^x(B) \subset [0,1]^{n_M}$ is an open ball.

Since, physically speaking, x should be restricted to $[0,1]^{n_M}$, this proposition allows us to restrict the values of x to $[0,1]^{n_M}$ in a natural way by using a function $h(x, v_M) \in C^\infty(x)$.

Now, we discuss an actual expression of $\tilde{\theta}(y)$ satisfying the condition (32) and other useful conditions for the next sections. The goal is to find a $\tilde{\theta}(y)$ that satisfies the following conditions 1) $\tilde{\theta}(y)$ satisfies (32), 2) $\tilde{\theta}(y) = 0$ for any $y \leq 0$, 3) $\tilde{\theta}(y) = 0$ for any $y \geq 0$, 4) for some $r \geq 0$ and for $l = 1, \ldots, r$ the derivatives $$\frac{d^l}{dy^l}\tilde{\theta}(y)\Big|_{y=0} = \frac{d^l}{dy^l}\tilde{\theta}(y)\Big|_{y=1} = 0.$$

It is easy to prove that the conditions 2-4 are satisfied by $$\tilde{\theta}^r(y) = \begin{cases} 1 & \text{for } y > 1 \\ \sum_{i=r+1}^{2r+1} a_i y^i & \text{for } 0 \leq y \leq 1 \\ 0 & \text{for } y < 0 \end{cases} \quad (37)$$

where the coefficients $a_i$ with $i = r+1, \ldots, 2r+1$ can be evaluated by requiring $$\sum_{i=r+1}^{2r+1} a_i = 1 \text{ and } \sum_{i=r+1}^{2r+1} \binom{i}{l} a_i = 0 \text{ for } l = 1, \ldots, r.$$

From the conditions 2-4 the polynomial $\Sigma_{i=r+1}^{2r+1} a_i y^i$ is also monotonous because the stationary points are only located on 0 and 1 (because of the condition 4). Therefore the polynomial $\Sigma_{i=r+1}^{2r+1} a_i y^i$ satisfying conditions 2-4 also satisfies (32).

We also can notice that $\lim_{r\to\infty} \tilde{\theta}^r(y) = \tilde{\theta}^r(y-1/2)$ and it is easy to show that a compact integral representation of $\Sigma_{i=r+1}^{2r+1} a_i y^i$ exists and reads $$\Sigma_{i=r+1}^{2r+1} a_i y^i = (\int_0^1 z^{r+1}(z-1)^{r+1}dz)^{-1}\int_0^y z^{r+1}(z-1)^{r+1}dz. \quad (38)$$

Figure 9:
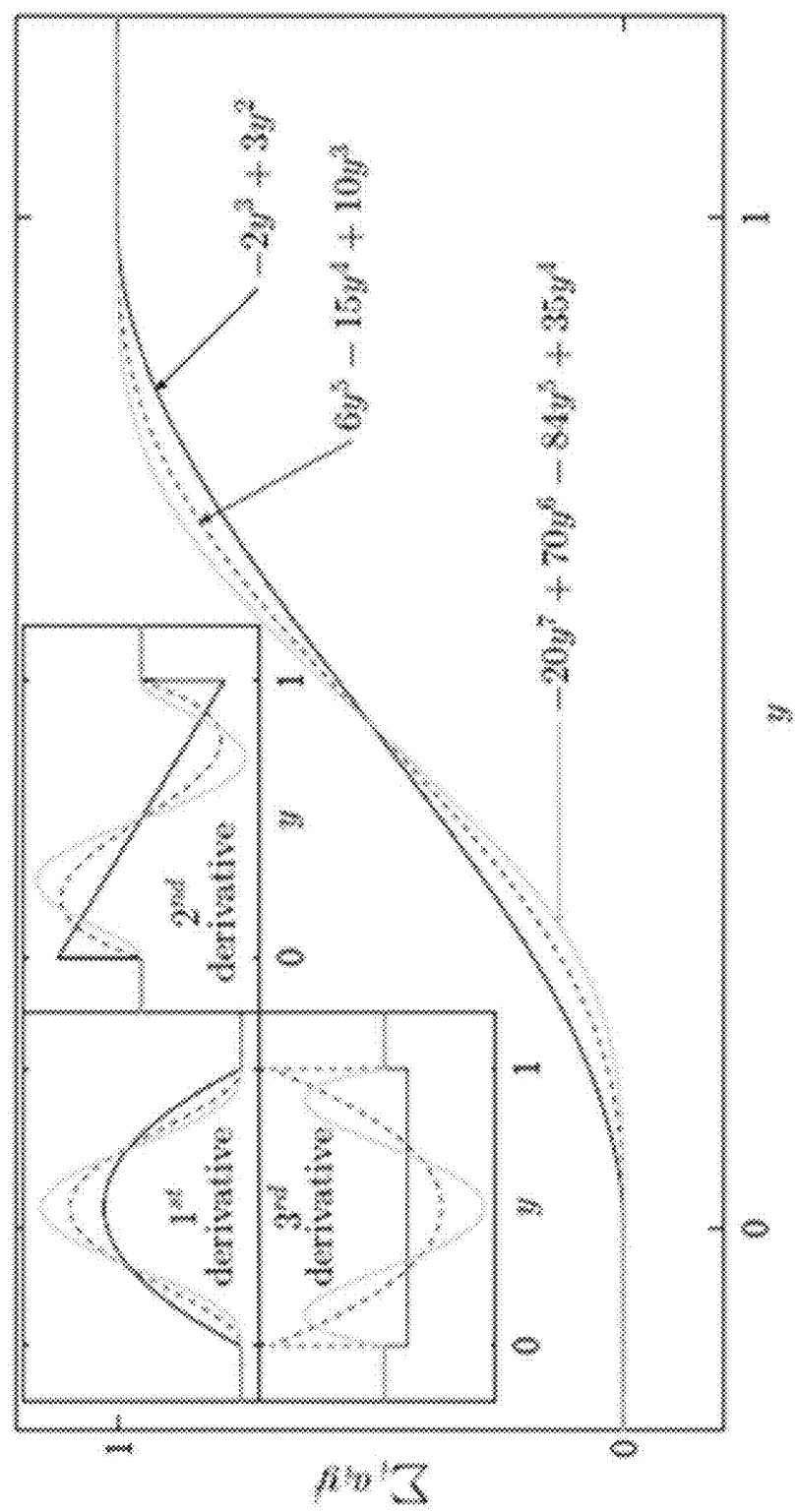
FIG. 9 illustrates examples of a function $\tilde{\theta}^r(y)$.

As an illustration the cases of r=1, 2 and 3 are in FIG. 9, which illustrates examples of a function $\tilde{\theta}^r(y)$ [Eq. (37)] for r=1 (black solid line), r=2 (dashed line) and r=3 (dashed-dot line), and the insets plot the 1st, 2nd and 3rd derivative; in FIG. 9.

In conclusion, Eq. (37) allows us to write the following proposition:

Proposition VI.3 Using (31) to represent $h(x, v_M)$ and (37) to represent $\tilde{\theta}(v_M)$, then, for any particular choice of r, we have that the function $$F_2(X) = -\alpha\mathcal{D}_{D[h(x, v_M)]}\mathcal{D}_{[g(x)]}v_M \quad (39)$$

on the r.h.s. of (22) defined on $x \in \mathbb{R}^{n_M} \times [0,1]^{n_M} \times \mathbb{R}^{2n_{DCG}}$ is in the class $C^r(x)$.

We finally briefly discuss an interesting physical consequence of modelling $h(x, v_M)$ using $\tilde{\theta}^r(y)$. In fact, if we consider $$h(x, v_M) = (1 - e^{-kx})\tilde{\theta}^r(y)\left(\frac{v_M}{2V_t}\right) + (1 - e^{-k(1-x)})\tilde{\theta}^r\left(-\frac{v_M}{2V_t}\right), \quad (40)$$

we can also interpret $V_t$ as the threshold of the memristor, thus the $\tilde{\theta}^r$ enables a natural and smooth way to include threshold effects in the memristor equations.

Equation (23)

Here, we have $\gamma > 0$. Each component of the vector function $f_{DCG}: \mathbb{R}^{n_M} \to \mathbb{R}^{n_{DCG}}$ actually depends on the voltage at the node where the VCDCG is connected. This voltage is expressed as a linear combination of the $v_M$ components $$v_{DCG_j} = u_j^T v_M + v_{0_j}, \quad (41)$$

where $u_j \in \mathbb{R}^{n_M}$ and $v_{0_j} \in \mathbb{R}$ are constant vectors. Therefore, we can write $$f_{DCG_j}(v_M) = f_{DCG_j}(v_{DCG_j}) = f_{DCG}(v_{DCG_j}). \quad (42)$$

The function we want to reproduce with our VCDCG is depicted in FIG. 7. This shape can be obtained in several ways using several smooth step functions like erf, arctan or even the $\theta^r$ we defined in the previous section. Therefore, we can assume that $f_{DCG_j}$ is at least of $C^r(v_{DCG})$.

Finally, the function $\rho$ also satisfies $$\rho_j(s) = \rho_j(s_j) = \rho(s_j), \quad (43)$$

and is expressed as $$\rho_j(s) = \tilde{\theta}^r\left(\frac{s_j - \frac{1}{2}}{\delta s}\right), \quad (44)$$

with $0 < \delta s \ll 1$. Therefore, we have the following proposition:

Proposition VI.4 The vector function $$F_3(x) = \mathcal{D}_{[\rho(s)]}f_{DCG}(v_M) - \gamma\mathcal{D}_{[\rho(1-s)]}i_{DCG} \quad (45)$$

on the r.h.s. of (23) defined on $x \in \mathbb{R}^{n_M} \times [0,1]^{n_M} \times \mathbb{R}^{2n_{DCG}}$ is at least of $C^r(x)$.

Figure 10:
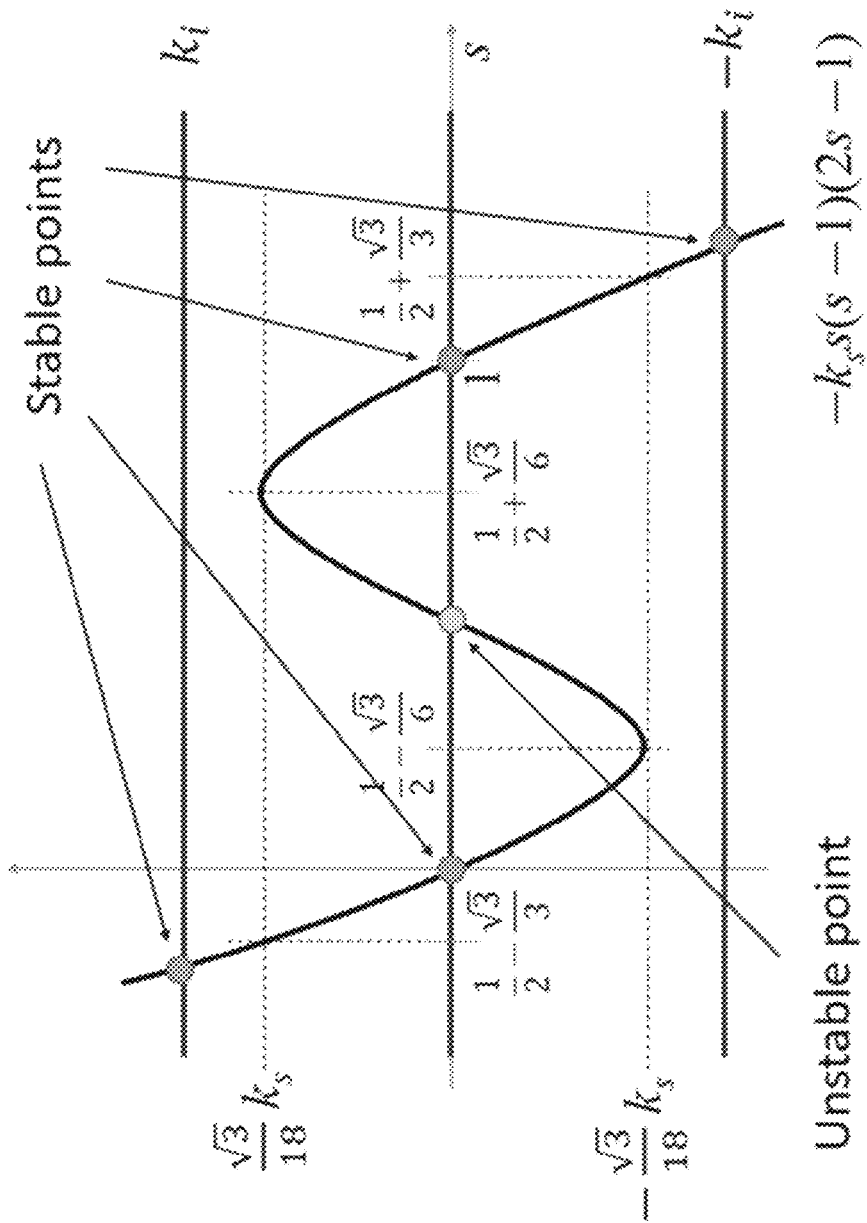
FIG. 10 is a plot of a stability graph.

FIG. 10 provides a stability graph of Eq. (24)

Equation (24)

In the r.h.s. of Eq. (24), we have the function $f_s: \mathbb{R}^{n_{DCG}} \times \mathbb{R}^{n_{DCG}} \to \mathbb{R}^{n_{DCG}}$ and it satisfies component wise $$f_{s_j}(i_{DCG}, s) = f_{s_j}(i_{DCG}, s_j) = f_s(i_{DCG}, s_j). \quad (46)$$

We can then discuss it as a scalar function of two variables neglecting the index j.

The function $f_S(i_{DCG}, s)$ is $$f_s(i_{DCG}, s) = -k_s s(s-1)(2s-1) +$$

$$k_i \left(1 - \prod_j \tilde{\theta}\left(\frac{i_{min}^2 - i_{DCG_j}^2}{\delta i}\right) - \prod_j \tilde{\theta}\left(\frac{i_{max}^2 - i_{DCG_j}^2}{\delta i}\right)\right), \quad (47)$$

with $k_s$, $k_i$, $\delta_i$, $i_{min}$, $i_{max} > 0$ and $i_{min} < i_{max}$. Note that when $k_i = 0$ Eq. (47) represents a bistable system. To understand the role of the variable s we notice that, by considering only the term in s in (47), it represents the bistable system with two stable equilibrium points in $s=0, 1$ and an unstable equilibrium in $s=1/2$. Now, we consider again the terms in $i_{DCG}$ and $\delta_i \ll i_{min}$. In this case, $\Pi_j \theta((i_{min}^2 - i_{DCG_j}^2)/\delta i) = 0$ if at least one $i_{DCG_j}$ satisfies $|i_{DCG_j}| > i_{min} + \delta i/2 \approx i_{min}$, otherwise the product is 1.

Therefore, if we consider $k_i > \sqrt{3/18} k_s$, we have the stability picture described in FIG. 10 where the line located at $k_i$ represents terms in $i_{DCG}$ of 47 for the case in which at least one $i_{DCG_j}$ satisfies $|i_{DCG_j}| > i_{max}$. Therefore, we have only one stable equilibrium.

The line located at 0 is for the case in which at least one $i_{DCG_j}$ satisfies $|i_{DCG_j}| > i_{min}$ and all $i_{DCG_j}$ satisfy $|i_{DCG_j}| > i_{max}$. Therefore, we have two possible stable equilibria and an unstable one.

The line located at $k_i$ is for the case in which all $i_{DCG_j}$ satisfy $|i_{DCG_j}| > i_{min}$. Therefore, we have only one stable equilibrium.

To summarize: if at least one $|i_{DCG_j}| > |i_{max}|$ then the variable s will approach the unique stable point for $$s < \frac{1}{2} - \frac{\sqrt{3}}{3} < 0,$$

while if all $|i_{DCG_j}| < |i_{DCG_{min}}|$ the variable s will approach the unique stable point for $$s > \frac{1}{2} + \frac{\sqrt{3}}{3} > 1.$$

If at least one $|i_{DCG_j}| > |i_{DCG_{min}}|$ and all $|i_{DCG_j}| < |i_{DCG_{max}}|$ then s will be either $$\frac{1}{2} - \frac{\sqrt{3}}{3} < s < \frac{1}{2} - \frac{\sqrt{3}}{6} \text{ or } \frac{1}{2} + \frac{\sqrt{3}}{6} < s < \frac{1}{2} + \frac{\sqrt{3}}{3}.$$

Now, from Eq. (23) and the definition (44) we have that, if at least one $|i_{DCG_j}| > |i_{DCG_{max}}|$, then $s<0$, $\rho(s)=0$ and $\rho(1-s)=1$ and reduces to $$\frac{d}{dt} i_{DCG} = i_{DCG}(v_M)$$

is bounded, the current $i_{DCG}$ is bounded and, if $k_s \gg \max(|f_{DCG}(v_M)|)$, we have $$\sup(|i_{DCG}|) = |i_{max}|. \quad (48)$$

Therefore, using the analysis in this section we can conclude with the following proposition:

Proposition VI.5 The vector function $$F_4(x) = -k_s s(s-1)(2s-1) + \quad (49)$$

$$k_i \left(1 - \prod_j \tilde{\theta}\left(\frac{i_{min}^2 - i_{DCG_j}^2}{\delta i}\right) - \prod_j \tilde{\theta}\left(\frac{i_{max}^2 - i_{DCG_j}^2}{\delta i}\right)\right),$$

on the r.h.s. of (23) defined on $x \in \mathbb{R}^{n_M} \times [0,1]^{n_M} \times \mathbb{R}^{2n_{DCG}}$ is at least of $C^r(x)$. Moreover, there exist $i_{max}$, $s_{max} < \infty$ and $s_{min} > -\infty$ such that the variables s and $i_{DCG}$ can be restricted to $[-i_{max}, i_{max}]^{n_{DCG}} \times [s_{min}, s_{max}]^{n_{DCGC}} \subset \mathbb{R}^{2n_{DCG}}$. In particular, $s_{max}$ is the unique zero of $F_4(s, i_{DCG}=0)$ This subset is invariant under the flow $\phi_t^{i_{DCG},s}$ of the dynamical system (25) restricted to the variable $i_{DCG}$ and s only. Moreover, the boundary points are limit point and for any open $B \subset [-i_{max}, i_{max}]^{n_{DCG}} \times [s_{min}, s_{max}]^{n_{DCG}}$ we have that $\phi_t^{i_{DCG},s}(B) \subset [-i_{max}, i_{max}]^{n_{DCG}} \times [s_{min}, s_{max}]^{n_{DCG}}$ is an open ball.

The last proposition that can be easily proven by using (28).

Proposition VI.6 If the variables $x \in [0,1]^{n_M}$, $i_{DCG} \in [-i_{max}, i_{max}]^{n_{DCG}}$ and $s \in [s_{min}, s_{max}]^{n_{DCG}}$ then there exist, $v_{max} < \infty$ and $v_{min} > -\infty$ such that $[s_{min}, s_{max}]^{n_{DCG}} \subset \mathbb{R}^{n_M}$ is an invariant subset under the flow $\phi_t^{v_M}$ of the dynamical system (25) restricted to the variable $v_M$ only.

Existence of a Global Attractor

Consider the system given by (21)-(24), or in compact form by (25). For our dynamical system (25) we can formally define the semigroup T(t) such that $$T(t)x = x + \int_0^t F(T(t')x)dt',$$

or defining $x(t)=T(t)x$ we have the more familiar.

$$T(t)x(0) = x(0) + \int_0^t F(x(t'))dt'. \quad (50)$$

Since we have proven in the previous sections that $F(x) \in C^r(X)$ with X the complete and compact metric space $X=[v_{min}, v_{max}]^{n_M} \times [0,1]^{n_M} \times [-i_{max}, i_{max}]^{n_{DCG}} \times [s_{min}, s_{max}]^{n_{DCG}}$, then T(t) is a $C^r$-semigroup.

We recall now that a $C^r$-semigroup is asymptotically smooth if, for any nonempty, closed, bounded set $B \subset X$ for which $T(t)B \subset B$, there is a compact set $J \subset B$ such that J attracts B. Here, the term "attract" is formally defined as: a set $B \subset X$ is said to attract a set $C \subset X$ under T(t) if $\text{dist}(T(t)C, B) \to 0$ as $t \to \infty$.

Moreover, we have that a semigroup T(t) is said to be point dissipative (compact dissipative) (locally compact dissipative) (bounded dissipative) if there is a bounded set $B \subset X$ that attracts each point of X (each compact set of X) (a neighborhood of each compact set of X) (each bounded set of X) under T(t). If T(t) is point, compact, locally, dissipative and bounded dissipative we simply say that T(t) is dissipative. Now we are ready to prove the following lemmas:

Lemma VI.7 The $C^r$-semigroup T(t) defined in (50) is asymptotically smooth.

Proof: In order to prove this lemma we first need to decompose T(t) as the sum $T(t)=S(t)+U(t)$. We take initially S(t) and U(t) as $$U(t)x(0) = \begin{pmatrix} v_M(0) - k_{DCG}\mathcal{U}^\dagger i_{DCG} + \mathcal{U}^\dagger v_o + \int_0^t F_1(x(t'))dt' \\ x(0) + \int_0^t F_2(x(t'))dt' \\ 0 \\ 0 \end{pmatrix} \quad (51)$$

$$S(t)x(0) = \begin{pmatrix} k_{DCG}\mathcal{U}^\dagger i_{DCG} - \mathcal{U}^\dagger v_o \\ 0 \\ i_{DCG}(0) + \int_0^t F_3(x(t'))dt' \\ s(0) + \int_0^t F_4(x(t'))dt' \end{pmatrix} \quad (52)$$

where $k_{DCG} > 0$, $v_o$ is the constant vector whose components are the $v_{oj}$ in (41), and $\mathcal{U}^\dagger$ is the pseudoinverse of the matrix $\mathcal{U}$ whose rows are the vectors $u_j^T$ in (41). It is worth noticing that for a well-defined SOLC it is easy to show that $\mathcal{U}\mathcal{U}^+ = I$ (the inverse, i.e. $\mathcal{U}\mathcal{U}^+ = I$, does not generally hold).

We also perform two variable shifts:

$$v_M \rightarrow v_M + \mathcal{U}^\dagger v_0 \quad (53)$$

$$s \rightarrow s - s_{max} \quad (54)$$

Since they are just shifts they do not formally change anything in Eqs. (51) and (52), except for additive terms in $\mathcal{U}^\dagger v_0$ and $s_{max}$. Also, the metric space changes accordingly $X \rightarrow [v_{min} + \mathcal{U}^\dagger v_0 + v_{max} + \mathcal{U}^\dagger v_0]^{n_M} \times [0,1]^{n_M} \times [-i_{max}, i_{max}]^{n_{DCG}} \times [s_{min}, s_{max} 0]^{n_{DCG}}$. To avoid increasing the burden of notation, in the following we will refer to all variables and operators with the same previous symbols, while keeping in mind the changes (53) and (54).

Now, by definition, U(t): $X \rightarrow [v_{min} + \mathcal{U}^\dagger v_0 + \mathcal{U}^\dagger v_0]^{n_M} \times [0,1]^{n_M} \times [0,0]^{n_{DCG}} \times [-s_{max}, -s_{max}]^{n_{DCG}}$ and it is easy to show that it is equivalent to the system.

$$C\frac{d}{dt}v_M = (A_v + B_v \mathcal{D}[g(x)])(v_M - \mathcal{U}^\dagger v_0) + b \quad (55)$$

$$\frac{d}{dt}x = -\alpha \mathcal{D}[h(x, v_M)]\mathcal{D}[g(x)])(v_M - \mathcal{U}^\dagger v_0) \quad (56)$$

$$i_{DCG} = 0 \quad (57)$$

$$s = -s_{max}. \quad (58)$$

By construction, from Eq. (28) and the definition of $h(x, v_M)$ in (40), U(t) represents a globally passive circuit. It is then asymptotically smooth, completely continuous [J. Hale, Asymptotic Behavior of Dissipative Systems, vol. 25 of Mathematical Surveys and Monographs. Providence, R.I.: American Mathematical Society, 2nd ed., 2010], and since it is defined in a compact metric space X, it is dissipative.

Now, following the lemma 3.2.3 of [4] we only need to prove that there is a continuous function k: $\mathbb{R}^+ \rightarrow \mathbb{R}^+$ such that $k(t,r) \rightarrow 0$ as $t \rightarrow \infty$ and $|S(t)x| \leq k(t,r)$ if $|x| < r$. In order to prove this statement, we first see that S(t) is equivalent to the system $$v_M = k_{DCG}\mathcal{U}^\dagger i_{DCG} \quad (59)$$

$$x = 0 \quad (60)$$

$$\frac{d}{dt}i_{DCG} = \mathcal{D}[\rho(s + s_{max})]f_{DCG}(v_M) + -\gamma\mathcal{D}[\rho(1 - s_{max})]i_{DCG} \quad (61)$$

$$\frac{d}{dt}s = f_s(i_{DCG}, s) \quad (62)$$

Since $v_M k_{DCG}\mathcal{U}^\dagger i_{DCG}$ we have that $f_{DCG}(v_M) = f_{DCG} = (k_{DCG}\mathcal{U}^\dagger i_{DCG})$ From the definition and discussion on $f_{DCG}$ given above, the variable change (41) and the definition of $\mathcal{U}^\dagger$, we have that $f_{DCG_j}(v_M) = f_{DCG_j}(v_{DCG_j}) = f_{DCG}(k_{DCG}i_{DCG_j})$ Now, since we consider $k_{DCG}$ such that $k_{DCG}i_{max} < v_c/2$, from the above discussion and considering the variable change (54), the unique stable equilibrium point for S(t) is x=0, and it is also a global attractor in X. Moreover, this equilibrium is hyperbolic, then there is a constant $\xi > 0$ such that $|S(t)x| \leq e^{-\xi t}$. This concludes the proof.

Lemma VI.8 The $C^r$-semigroup T(t) defined in (50) is dissipative.

Proof: From lemma VI.7 T(t) is asymptotically smooth, then from the corollary 3.4.3 of [J. Hale, Asymptotic Behavior of Dissipative Systems, vol. 25 of Mathematical Surveys and Monographs, Providence, R.I., American Mathematical Society, 2d Edition 2010] there is a compact set which attracts compact sets of X. There is also a compact set which attracts a neighborhood of each compact set of X. Therefore, since our X is bounded, the lemma follows.

At this point we recall some other definitions and results from topology of dynamical systems that can be found, e.g., in Hale and will be useful for the next discussions.

For any set $B \subset X$, we define the ω-limit set ω(B) of B as $\omega(B) = \cap_{s \geq 0} Cl \cup_{t \geq s} T(t)B$. A set $J \subset X$ is said to be invariant if, T(t)J=J for t≥0. A compact invariant set J is said to be a maximal compact invariant set if every compact invariant set of the semigroup T(t) belongs to J. An invariant set J is stable if for any neighborhood V of J, there is a neighborhood $V' \subseteq V$ of J such that $T(t)V' \subset V'$ for t≥0. An invariant set J attracts points locally if there is a neighborhood W of J such that J attracts points of W. The set J is asymptotically stable (a.s.) if J is stable and attracts points locally. The set J is uniformly asymptotically stable (u.a.s.) if J is stable and attracts a neighborhood of J. An invariant set J is said to be a global attractor if J is a maximal compact invariant set which attracts each bounded set $B \subset X$ In particular, ω(B) is compact and belongs to J and if J is u.a.s. then $J = \cup_B \omega(B)$.

Now, we are ready to prove the following theorem:

Theorem VI.9 The $C^r$-semigroup T(t) defined in (50) possesses an u.a.s. global attractor A.

Proof: From the lemmas VI.7 and VI.8 we have that T(t) is asymptotically smooth and dissipative. Moreover, since X is bounded, orbits of bounded sets are bounded and then the theorem follows directly from the theorems 3.4.2 and 3.4.6 of Hale.

Equilibrium Points

With the previous lemmas and theorem, we have proved that T(t) has an u.a.s. global attractor. Roughly speaking this means that, no matter the choice of initial conditions $x(0) \in X$, T(t)x(0) will converge asymptotically to a compact bounded invariant set A. Since in our case X is a compact subset of $\mathbb{R}^{2n_M + 2n_{DCG}}$, A can contain only equilibrium points, periodic orbits and strange attractors, and all of them are asymptotically stable. We first show that the dynamics converge exponentially fast to the equilibria. We will then argue about the absence of periodic orbits and strange attractors.

From the above analysis it follows that the equilibria must satisfy of $u_j^T v_M + v_{0_j} = -v_c$, $0$, $v_c$ for any j. Moreover, $u_j^T v_M + v_{0_j} = 0$ leads to unstable equilibria, while of $u_j^T v_M + v_{0_j} = \pm v_c$, leads to asymptotically stable ones. However, these equilibria can be reached if the necessary condition $$\frac{1}{2} + \frac{\sqrt{3}}{6} < s < s_{max} \text{ and } |i_{DCG_j}| < |i_{DCG_{max}}| \tag{63}$$

holds.

For our purposes, we need to have $i_{DCG} = 0$. In fact, at the equilibria the SOLC has voltages at gate nodes that can be only either $-v_c$ or $v_c$. In such configuration of voltages, as discussed above, the gates can stay in correct or non-correct configuration. In the former case no current flows from gate terminals due to the dynamic correcting modules and so the correspondent component of $i_{DCG}$ must be 0 at the equilibrium. On the other hand, if the gate configuration is not correct, at equilibrium we have currents of the order of $v_c/R_{on}$ that flow from the gates terminals. These currents can be compensated only by the components of $i_{DCG}$. Therefore, if we indicate with $K_{wrong} \, v_c/R_{on}$ the minimum absolute value of the current flowing from the terminals of the gates when in the wrong configuration, $K_{wrong} = O(1)$, and consider VCDCG with $$i_{DCG_{max}} < K_{wrong} v_c/R_{on}, \tag{64}$$

we have that the equilibria with nonzero components of $i_{DCG}$ disappear and only equilibria for which $i_{DCG} = 0$ survive. With this discussion we have then proven the following theorem Theorem VI.10 If the condition (64) holds, the u.a.s. stable equilibria for T(t), if they exist, satisfy $$i_{DCG_j} = 0 \tag{65}$$

$$s_j = s_{max} \tag{66}$$

$$|u_j^T v_M + v_{0_j}| = v_c \tag{67}$$

for any j=1, . . . , $n_{DCG}$. Moreover, this implies that the gate relations are all satisfied at the same time.

This theorem is extremely important because it is the same as:

Theorem VI.11 T(t) has equilibria iff (if and only if) the CB problem implemented in the SOLC has solutions for the given input.

We can analyze the equilibria further to prove their exponential convergence. With this aim in mind, we first analyze Eq. (22) at an equilibrium. In this case, for each memristor we can have two possible cases: $v_{M_j} = -R_{off}|i_{M_j}|$, with $|i_{M_j}|$ the absolute value of the current flowing through the memristor and it is an integer >1 times $v_c/R_{off}$ (this can be proven substituting values of $v_0$, $v_1$ and $v_2$ in equation (19) that satisfies the SOgates and using coefficients of table I) and then $x_j=1$. In the second case we have $v_{M_j}=0$ and $x_j$ can take any value in the range [0, 1]. The latter case implies that the equilibrium is not unique for a given $v_M$ but we have a continuum of equilibria, all of them with the same $v_M$, s and $i_{DCG}$ but different x. The indetermination of some components of x (those related to the components $v_M$ equal to 0) creates center manifolds around the equilibria. However, these center manifolds are irrelevant to the equilibria stability since they are directly related to indetermination of the components of x and these components can take any value in their whole range [0, 1]. Therefore, we have to consider only the stable manifolds of the equilibria.

In conclusion, since in the stable manifolds $C^r$ semigroups with r≥1 have exponential convergence, and in our case the center manifolds do not affect the convergence rate, this proves the following theorem Theorem VI.12 The equilibrium points of T(t) have exponentially fast convergence in all their attraction basin.

Finally, in order to check the scalability of SOLCs, we want to study how the convergence of the equilibria depends on their size. We then write down the Jacobian of the system around an equilibrium point. Following the conditions in the theorem VI.10 and the above analysis, it can be shown that the Jacobian of F(x) of equation (25) evaluated in an equilibrium reads $$J_F(x=x_s) = \begin{pmatrix} \frac{\partial F_1}{\partial v_M} & \frac{\partial F_1}{\partial x} & C^{-1}A_i & 0 \\ 0 & \frac{\partial F_2}{\partial x} & 0 & 0 \\ \frac{\partial f_{DCG}}{\partial v_M} & 0 & 0 & 0 \\ 0 & 0 & 0 & \frac{\partial f_s(i_{DCG}, s)}{\partial s} \end{pmatrix} \tag{68}$$

We also assume that in the second block row we have eliminated all equations for which $v_{M_j}=0$ holds, and from the second block column we have eliminated all columns related to the indeterminate $x_j$. This elimination is safe for our analysis since we want to study the eigenvalues of $J_F$. In fact, we notice that the eigenvectors related to the non-null eigenvalues are vectors with null components corresponding to the indeterminate $x_j$ since they are related to zero rows of $J_F$.

We can see from (68) that, since the last block column and row of $J_F$ have all zero blocks but the last one, the eigenvalues of $J_F(x=x_s)$ are simply the union of the eigenvalues of $$\frac{\partial f_s(i_{DCG}, s)}{\partial x}$$

and the eigenvalues of $$J_{F_{red}}(x=x_s) = \begin{pmatrix} \frac{\partial F_1}{\partial v_M} & \frac{\partial F_1}{\partial x} & C^{-1}A_i \\ 0 & \frac{\partial F_1}{\partial x} & 0 \\ \frac{\partial f_{DCG}}{\partial v_M} & 0 & 0 \end{pmatrix}. \tag{69}$$

Now, since $$\frac{\partial f_s(i_{DCG}, s)}{\partial x}$$

is a diagonal matrix proportional to the identity I, more explicitly $$\frac{\partial f_s(i_{DCG}, s)}{\partial x} = -k_s(6s_{max}^2 - 6s_{max} + 1)I,$$

its associated eigenvalues do not depend on the size of the circuit.

In order to study the spectrum of $J_{F_{red}}$ we notice that we have $$\frac{\partial f_{DCG}}{\partial v_M} = L_{DCG}u$$

where the derivative is evaluated in either $v_{DCG_j} = v_c$ or $-v_c$ according to the equilibrium point. So, the eigenvalues of $J_{F_{red}}$ are the time constants of an RLC memristive network. While it is not easy to say something about the time constants of a general RLC network, in our case there are some considerations that can be made. The capacitances, inductances, resistances are all equal (or very close to each other if noise is added). Moreover, the network is ordered, in the sense that there is a nontrivial periodicity and the number of connection per node is bounded and independent of the size. From these considerations, our network can actually be studied through its minimal cell, namely the minimal sub-network that is repeated to form the entire network we consider. This implies that the slower time constant of the network is at most the number of cells in the network times the time constant of the single cell. Under these conditions we have then proved the following theorem:

Theorem VI.13 Polynomially growing SOLCs support at most polynomially growing time constants.

We have proved above that T(t) is endowed with an u.a.s. global attractor. We have also provided an analysis of the equilibria proving their exponential convergence in the whole stable manifolds and discussed their convergence rate as a function of the size of the system, showing that this is at most polynomial. Therefore, in order to have a complete picture of a DMM physically realized with SOLCs, the last feature should be discussed: the composition of the global attractor.

In order to analyze the global attractor, we use a statistical approach. We make the following assumptions:

1) The capacitance C is small enough such that, if we perturb a potential in a node of the network the perturbation is propagated in a time $\tau_C C \ll \tau_M(\alpha)$ where $\tau_M(\alpha)$ is the switching time of the memristors (obviously linear functions of the inverse of $\alpha$). For our system the time constant $\tau_C$ is related to the memristance and C.

2) q of the function $f_{DCG}$ (see FIG. 7) is small enough such that the time $\tau_{DCG}(q) \, i_{DCG_{max}}/q$, satisfies $\gamma^{-1} \ll \tau_{DCG}$, i.e., the the time that the current $i_{DCG}$ takes to reach $i_{DCG_{max}}$ is much smaller than the time it takes to reach $i_{DCG_{max}}$.

3) The switching time of the memristors satisfies $\gamma^{-1} \ll \tau_M(\alpha) \ll \tau_{DCG}$.

4) The initial condition of x is taken randomly in X.

Before proceeding, we describe a peculiar behavior of our SOLCs that can be proved by the nonlocality induced by Kirchhoff's current laws and looking at how the DCMs work. If we change a potential of order $\delta V$ in a point of the network "quasi instantaneously", namely within a switching time $\tau_C \ll \tau \ll \tau_M(\alpha)$, there will be a sub-network S—including the point switched—that in a time of the order of $\tau_C$ will change of the same order of $\delta V$ many of the potentials at the nodes. This change is simply the result of the RC nature of the network, the only component that survives at the time scale of $\tau_C$. After a time of the order of $\tau_M(\alpha)$, the subnetwork S will reach a stable configuration as consequence of the DCMs. Therefore, for a perturbation $\delta V$ in a node of the circuit, there is, in a time $\tau_M(\alpha)$, a reconfiguration of an entire region S of the network.

If in a given node j the current $i_{DCG_j}$ reaches $i_{DCG_{max}}$ the equation that governs $i_{DCG}$ becomes $d \, i_{DCG} = -\gamma i_{DCG}$, so the currents decrease to $i_{min}$ in a time of the order of $\gamma^{-1}$. If we set $i_{min}$ very small compared to the characteristic currents of the network, in a time of the order of $\gamma^{-1}$ the potential at the node j will experience a potential variation $\delta V$ of the order of $R_{on} i_{max}$ if $i_{max}$ is large enough.

Moreover, since $\tau_M(\alpha) \ll \tau_{DCG}$ the network reconfigures the region S before the current $i_{DCG_j}$ starts increasing again.

With this in mind, and using the above conditions 1-4 we can make a statistical interpretation of our network. We consider a system large enough and, since it is made of a combination of elementary cells, we assume that $\tau_C$ is small enough such that the density of the nodes is uniform in the subnetwork S. Taking as initial x(0) a random point in X, we have that at the rate of $\tau_{DCG}^{-1}$ a fraction $m_{DCG}/n_{DCG}$ of VCDCG reaches $i_{max}$ and consequently switches. This means that there is a fraction of nodes that are kicked by $\delta V \approx K_{wrong} v_c / R_{on}$ at a rate of $\tau_{DCG}^{-1}$.

Following our discussion above, if $x_-$ is the configuration of the system before the kick, and $x_+$ after (their temporal distance is of the order of $\gamma^{-1}$), then we have that the distance dist($x_-$, $x_+$) is of the order of the radius of X defined as in $f_{y \in X} \sup_{x \in X}$ dist(x,y). This means that these kicks bring the system in points of X that are far from each other. Since we have chosen the initial x(0) random in X, also the kicks will take place randomly in time and in space (i.e., in the network node). This means that the system explores the entire X. It is worth noticing that, like in the case of Monte Carlo simulations, when we estimate an integral in N dimensions [F. Rossi, Theory of Semiconductor Quantum Devices, Macroscopic Modeling and Simulation Strategies. Berlin: Springer-Verlag, 2016], here the SOLC explores X in a way that is linear in the number of variables, i.e., it needs a number of kicks that grows at most linearly with the dimension of the system.

All this analysis allows us to conclude that, in our SOLCs, periodic orbits or strange attractors cannot co-exist with equilibria. In fact, both the periodic orbits and/or strange attractors, if they exist, produce large fluctuations of the potentials of the SOLC. These fluctuations are of the order of $v_c/R_{on}$ and are not localized but rather distributed in the entire network, because of the combination of VCDCGs and DCMs. Therefore, from the previous analysis, if periodic orbits and/or strange attractors exist they should force the system to explore the entire space X. However, if an equilibrium point exists, then, by exploring X the system will intercept, within a time of order $\tau_{DCG}$ times a number that grows only linearly with the size of the system, the stable manifold of X and collapses in the equilibrium point. Therefore, the global attractor is either formed by only equilibrium points or only by periodic orbits and/or strange attractors.

I. Polynomial Energy Expenditure

We finally note that the SOLCs grow polynomially with the input size, each node of each gate can support only finite voltages (cut-off by the capacitances C) and at the equilibrium the voltages do not depend on the size of the system. The currents are also limited and their bounds are independent of the size of the SOLCs. The solution is found in a finite time which is polynomially dependent on the size of the SOLCs. Therefore, the energy expenditure can only grow polynomially with the SOLC size.

This can be also seen in a more mathematical way as follows. The metric space $X=[v_{min},v_{max}]^{n_M} \times [-i_{max}, i_{max}]^{n_{DCG}} \times [s_{min},s_{max}]^{n_{DCG}}$ is a bounded compact space with the support of its range that does not depend on the SOLC size, hence, as a consequence the energy expenditure can only grow polynomially with SOLC size.

We now provide numerical evidence of all these statements by solving two different NP problems, one hard.

VNP Problems Solution with DMMS

Prime Factorization

Let us consider an integer n=pq where p and q are two prime numbers. Moreover, we define $p_j$, $q_j$, and $n_j$ the binary coefficients of p, q and n such that $p=\Sigma_{j=0}^{n_p} p_j 2^j$ and similarly for q and n. Therefore, $n_p$, $n_q$, and $n_n$ are the number of bits of p, q, and n respectively. The NP problem consists in finding the two unique primes p and q such that n=pq.

Figure 11:
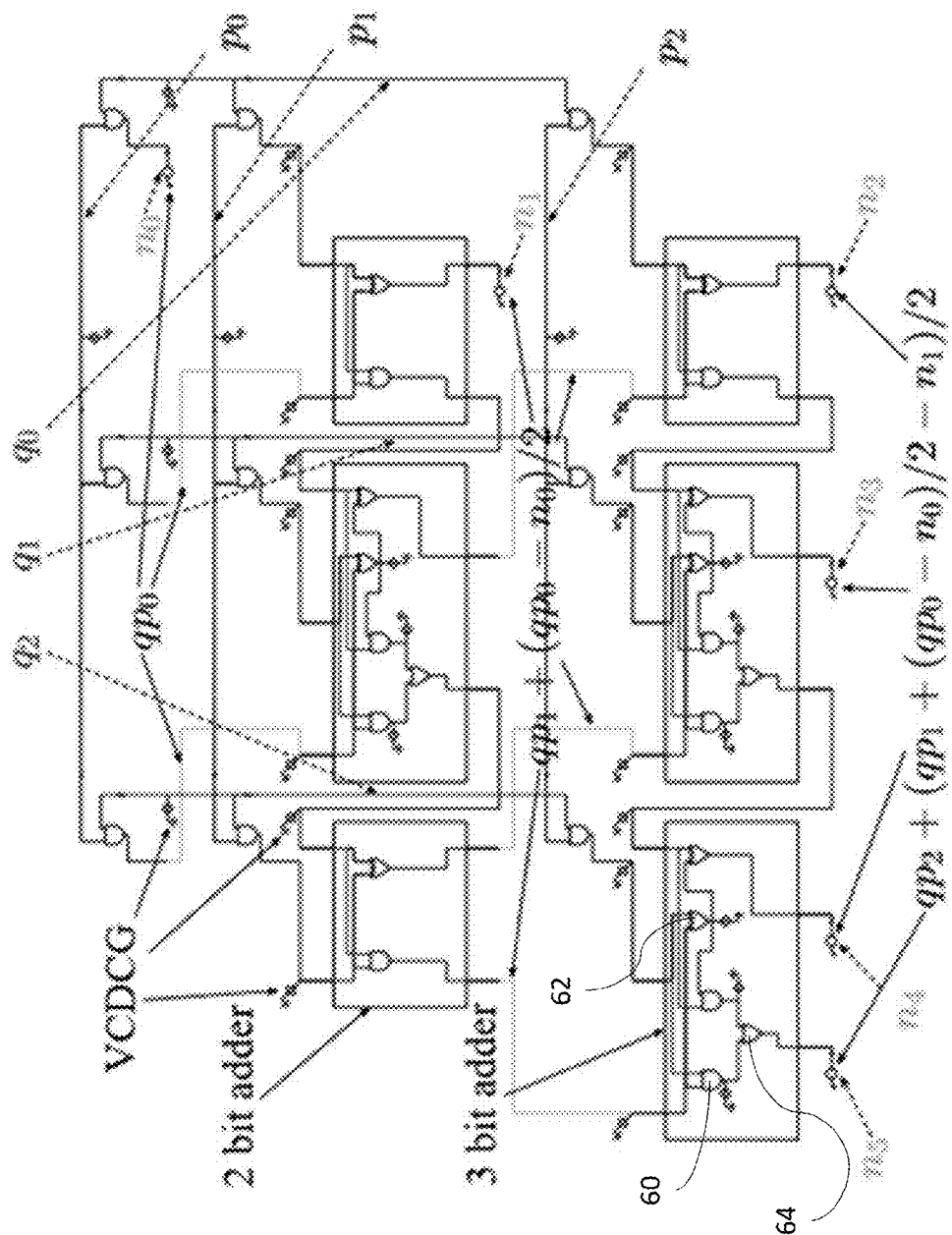
FIG. 11 is an example SOLC circuit that includes a two-bit and three-bit adder for solving a 6-bit factorization problem.

Starting from the $f(y)=b$ we can build the SOLC 60 as shown in FIG. 11 for $n_n=6$. The inputs of the SOLC are the generators indicated by the $n_j$. These generators impose voltages $v_c$ or $-v_c$ according to the logical value of $n_j$. Therefore, this set of generators is the control unit of the DMM and encodes b. The lines at the same potential indicated by $p_j$ and $q_j$ are the output of our problem, i.e., they encode—through the voltages—the coefficients $p_j$ and $q_1$ (namely y). In order to read the output of the SOLC it is thus sufficient to measure the potentials at these lines. It is worth noticing that, once the gates have self-organized, the values of the potentials at all the lines will be either $v_c$ or $-v_c$. Therefore, there is no issue With precision in reading the output, implying robustness and scalability of the circuit.

Scalability Analysis—

FIG. 11 shows a preferred SOLC for solving a 6-bit factorization problem. The circuit can be easily designed using the standard logic gates to compute the product of two integers and then substitute the standard logic gates by SOLGs. The circuit is composed of the SOLGs described above. In particular the SO AND 60, the SO XOR 62 and the SO OR 64. The circuit in FIG. 11 can be built for any size of b and the number of SOLGs grows as $n^2$, so the SOLGs scale quadratically with the input. From the analysis above, the equilibria of this SOLC are the solutions of the factorization problem and they can be exponentially reached in a time at most polynomial in $n_n$. Finally, since the energy of this circuit depends linearly on the time it takes to find the equilibrium and on the number of gates, also the energy is bounded. We thus conclude that such circuits will solve factorization with polynomial resources also if implemented in hardware.

On the other hand, to simulate this circuit. i.e., to solve the ODE (25), we need a bounded small time increment dt independent of the size of the circuit, and dependent only on the fastest time constant that can be associated to the time scales discussed above. It is worth noticing that the problem has no solution within this SOLC if either n is already a prime, or at least one of $n_p$ or $n_q$ used to build the SOLC is smaller than the actual length of p or q used to solve the factorization problem. This last scenario can always be avoided by simply choosing $n_p=n_n-1$ and $n_q=\lfloor n_n/2 \rfloor$ (or the reverse), where $\lfloor . \rfloor$ stands for the floor operator, i.e., it rounds the argument to the nearest integer towards minus infinity. This choice also guarantees that, if the p and q are primes, the solution is unique, and the trivial solution $n=n \times 1$ is forbidden.

TABLE II

SIMULATION PARAMETERS

| parameter | value |
| --- | --- |
| $R_{on}$ | $10^{-2}$ |
| $\alpha$ | 60 |
| $V_t$ | 0 |
| $m_0$ | −400 |
| $i_{max}$ | 20 |
| $\delta_s$ | 0 |
| $R_{off}$ | 1 |
| C | $10^{-9}$ |
| $\gamma$ | 60 |
| $m_1$ | 400 |
| $k_i$ | $10^{-7}$ |
| $\delta_i$ | 0 |
| $v_c$ | 1 |
| k | $\infty$ |
| q | 10 |
| $i_{min}$ | $10^{-8}$ |
| $k_s$ | $10^{-7}$ |

We have implemented the circuit into a circuit simulator. For the sake of simplicity, we have implemented SOLCs with $n_p=n_q$ with length at most of $n_n=n_p+n_q$. In this case, because of symmetry the possible solutions are two.

Numerical Simulations—

Figure 12:
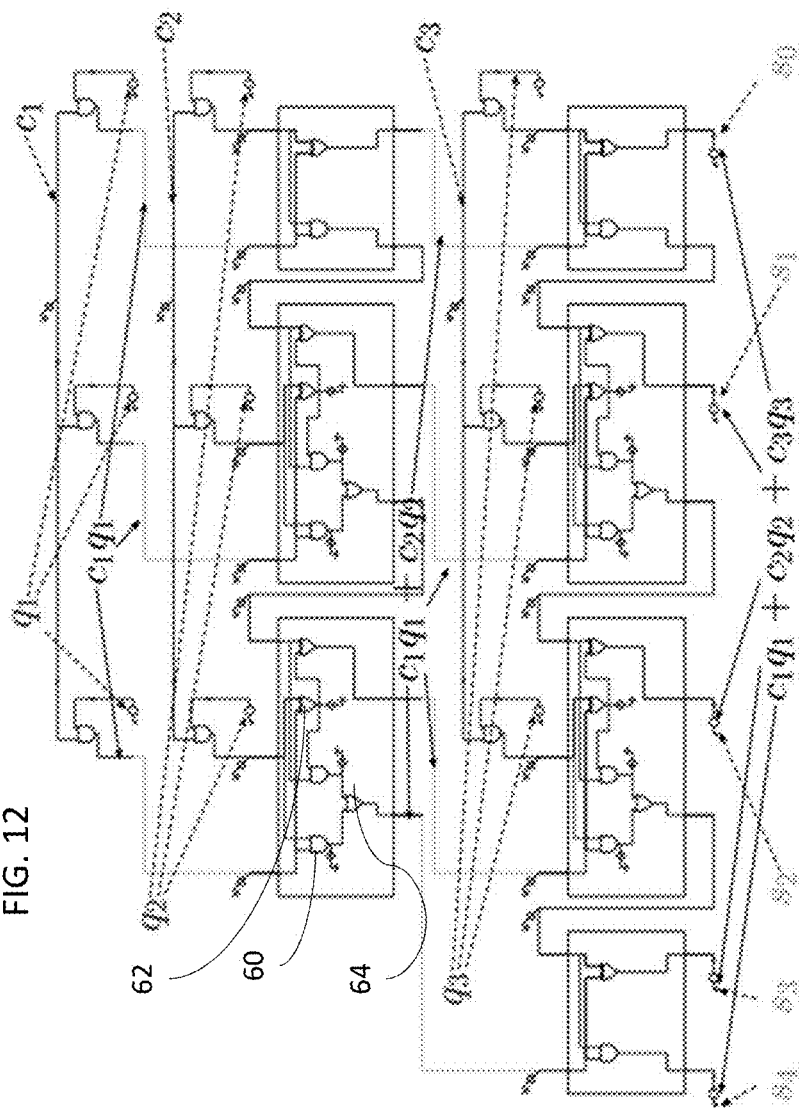
FIG. 12 is an example preferred SOLC circuit for solving a 3-number, 3-bit subset-sum problem FIGS. 13A-13D respectively illustrate SO AND and OR gates formed with memristors, with dynamic correction modules at each terminal and required error a SO-NOT gate, and correction logic.

The simulations were performed by starting from a random configuration of the memristor internal variable x and switching on gradually the generators. Although not necessary, we used a switching time for the generators which is quadratic in $n_n$. We chose $v=1$. After a transient, all terminals approach $\pm v_c$, which are the logical 1 and 0. When, thanks to the DCMs, all of them converge to $\pm v_c$, they are necessarily satisfying all gate relations, and the SOLC has then found the solution. Plots are provided in a publication concerning the invention available at https://arxiv.org/pdf/1512.05064 and entitled "Polynomial-time solution of prime factorization and NP-hard problems with digital memcomputing machines," (Apr. 22, 2016)(FIGS. 12 and 13).

We have performed hundreds of simulations using a 72-CPU cluster, and have not found a single case in which the SOLCs did not converge to the equilibria. It is also worth noticing that the larger case we dealt with (18-bit case) requires the simulation of a dynamical system with approximately 11,000 independent dynamic variables (i.e., $v_M$, x, $i_{DCG}$ and s). We are thus dealing with an enormous phase space and yet we did not find anything other than equilibria. Clearly, this does not prove the absence of strange attractors or limit cycles for all possible sizes, but at least for the parameters we have used (see table II).

The Subset-Sum Problem.

We now show how to solve, with polynomial resources, within a SOLC the NPhard version of the subset-sum problem (SSP), which is arguably one of the most important problems in complexity theory [M. R. Garey and D. S. Johnson, Computers and Intractability; A Guide to the Theory of NP-Completeness. New York, N.Y., USA: W. H. Freeman & Co., 1990.]. The problem is defined as follows: if we consider a finite set $G \subset \mathbb{Z}$ of cardinality n, we want to know whether there is a nonempty subset $K \subseteq G$ whose sum is a given number s (NP-complete version). In addition, we will seek to find at least one subset (if it exists) that solves the problem (NP-hard version). The complexity of the SSP is formulated in terms of both its cardinality (n) and the minimum number of bits used to represent any element of G (namely the precision p). The problem becomes difficult to solve when n and p are of the same order because the known algorithms to solve it are exponential in either n or p.

We consider here the NP-hard version of the SSP in which all elements of G are positive. The case in which they are not can be equally implemented in the SOLCs but requires a slightly more complex topology and will be reported elsewhere. In order to solve the SSP we try to find the collection of $c_j \in Z_2$ such that $$\Sigma_j c_j q_j = s \qquad (70)$$

where $q_j \in G$ and $j=1, \ldots, n$. Therefore, our unknowns are the $c_1$, with y the collection of the $c_j$. Equation (70) can be readily represented in Boolean form through a Boolean system $f(y)=b$ where b is composed by the binary coefficients of s padded with a number of zeros such that dim(b) equals P the minimum number of binary coefficients used to express $\Sigma_j q_j$. It is easy to show that $\dim(b) \leq \log_2(n-1)+p$. This Boolean system can be implement in a SOLC as shown in FIG. 12. FIG. 12 shows an example SOLC for solving a 3-number, 3-bit subset-sum problem. It can be designed using standard logic gates to calculate the sum of integers multiplied each one by an unknown bit and then substitute the standard logic gates by SOLGs. The circuit is composed of the SOLGs described above. In particular the SO AND 60, the SO XOR 62 and the SO OR 64. The control unit is here composed by the generators that implement the binary coefficients of s and the output can be read out by measuring the voltages at the lines pointed out by the $c_j$ in FIG. 12.

Scalability Analysis—

This circuit grows linearly in p and as $n+\log_2(n-1)$ in n. The last term is due to the successive remainders during the sum in (70). This is represented by the extra adders on the left of the SOLCs in FIG. 12. Also in this case, like the factorization, we have a SOLC that grows polynomially with both p and q so the SSP belongs to the $MPI_M$ class, indicating that, unlike the Turing paradigm, factorization and the subset-sum problem share the same complexity within the memcomputing paradigm.

Numerical Simulations—

We have performed simulations of the SOLCs in a similar way as the factorization. As in the case of the factorization, the solution is found when all gate voltages are either 1 or −1 (logical 1 and 0, respectively). We have performed an extensive analysis of this case as well and up to n=9 and p=9 no periodic orbits or strange attractors have been found by starting from random initial conditions. Finally, also for the subset-sum problem, if no solution exists the system will not converge to any equilibrium.

Discussion on the NP=P Problem

The resources used to simulate DMMs and, in particular, SOLCs can be quantified in the number of floating point operations the CPU does to simulate them. Since we are actually integrating an ODE, $\dot{x}=F(x)$, (Eq. (25)), the number of floating point operations depends i) linearly (if we use a forward integration method like the forward Euler or Runge-Kutta [J. Stoer and R. Bulirsch, Introduction to numerical analysis. Springer Verlag, 2002]) or at most quadratically (if we use a backward method like backward Euler or Trapezoidal rule [Id.]) in dim(x), and ii) depends on the minimum time increment we use to integrate with respect to the total period of simulation, or in other words depends linearly on the number of time steps $N_t$. We discuss them separately. We have seen above that for NP problems we have that the dim(x) scales polynomially in the input of the problem (quadratically in the number of bits for the factorization, and linearly in both the precision and the cardinality of the set G for the SSP). Note also that we solve these NP problems by mapping them into a more general NP-complete problem, the Boolean satisfiability (SAT) problem and then we build the SOLCs by encoding directly the SAT representing the specific problem (this SAT is in compact Boolean form that we indicate with $f(y)=b$). This means that the dim(x) depends linearly on the number of elementary logic gates (i.e., AND, OR, XOR) used to represent the SAT.

The number of time steps, $N_t$, to perform the simulations has a double bound. The first one depends on the minimum time increment $\Delta t$, and the second on the minimum period of simulation $T_s$. The former depends on the smallest time constant of the SOLC. Ultimately, this time constant does not depend on the size of the circuit, but on the nature of the single devices we are simulating. On the other hand, $T_s$ can depend on the size of the system. In fact, it is the minimum time we need to clearly find the equilibria of the system. It is thus related to the largest time constant of the system. However, it was shown above that $T_s$ grows at most polynomially with the size of the problem. From all this, one can then infer that we can simulate polynomially a DMM using a Turing machine, suggesting NP=P. The present machines can be fabricated either with circuit elements with memory (such as memristors) and/or standard MOS technology. They do not require cryogenic temperatures or to maintain quantum coherence to work since they are essentially classical objects, and map integers into integers. Therefore, they are quite robust against noise like our present digital Turing machines implemented within the von Neumann architecture.

Memristor SOLG Gates

In preferred embodiments, the SOLG memristor devices are realized with memristors. FIGS. 13A-13D respectively illustrate SO AND and OR gates formed with memristors 70, a with dynamic correction modules 72 at each terminal, a SO-NOT gate and the required dynamic correction logic. The memristors 70 can be either emulated using standard CMOS technology or fabricated via conventional techniques. The dynamic correction module is formed by a resistance R, a nonlinear conductance $G(v)=-(v-c)(v+c)$, and two identical memristors M with different polarizations. Each of them is connected to a voltage driven voltage generator with linear driven functions $L_1, L_2, L_3, L_4$. As defined in the table that follows, the Linear functions are not unique.

The dynamic correction modules 72 are realized with voltage driven voltage generators with linear driven functions $L_1, L_2, L_3, L_4$. The Linear functions are not unique and can be chosen to satisfy the following relations, for example:

| Self-Organizing AND | | | | | | Self-Organizing OR | | | | | |
| --- | --- | --- | --- | --- | --- | --- | --- | --- | --- | --- | --- |
| $v_1$ | $v_2$ | $v_o$ | $i_1$ | $i_2$ | $i_o$ | $v_1$ | $v_2$ | $v_o$ | $i_1$ | $i_2$ | $i_o$ |
| $v_c$ | $v_c$ | $v_c$ | 0 | 0 | 0 | $v_c$ | $v_c$ | $v_c$ | 0 | 0 | 0 |
| $v_c$ | $-v_c$ | $-v_c$ | 0 | 0 | 0 | $v_c$ | $-v_c$ | $v_c$ | 0 | 0 | 0 |
| $-v_c$ | $v_c$ | $-v_c$ | 0 | 0 | 0 | $-v_c$ | $v_c$ | $v_c$ | 0 | 0 | 0 |
| $-v_c$ | $-v_c$ | $-v_c$ | 0 | 0 | 0 | $-v_c$ | $-v_c$ | $-v_c$ | 0 | 0 | 0 |
| $v_c$ | $v_c$ | $-v_c$ | $2i_e$ | $2i_e$ | $4i_e$ | $v_c$ | $v_c$ | $-v_c$ | $2i_e$ | $2i_e$ | $4i_e$ |
| $v_c$ | $-v_c$ | $v_c$ | 0 | $-2i_e$ | $-2i_e$ | $v_c$ | $-v_c$ | $-v_c$ | $2i_e$ | 0 | $2i_e$ |
| $-v_c$ | $v_c$ | $v_c$ | $-2i_e$ | 0 | $-2i_e$ | $-v_c$ | $v_c$ | $-v_c$ | 0 | $2i_e$ | $2i_e$ |
| $-v_c$ | $-v_c$ | $v_c$ | $-2i_e$ | $-2i_e$ | $-4i_e$ | $-v_c$ | $-v_c$ | $v_c$ | $-2i_e$ | $-2i_e$ | $-4i_e$ | where $i_e = v_c/R_{on}$ is the current that flows in a memristor when a voltage $v_c$, is applied and the memristor is switched to $R_{on}$.

The first four relations (first four rows) between voltage and current are the relations that guarantee that the correct configurations of the self-organizing gates are stable (no currents flow from the terminals so no signal tries to change the state of the logic gate). On the other hand, the last four relations (last four rows) guarantee currents that drive the logic gates to some stable configuration The SO NOT of FIG. 13C is a two port electronic device that must satisfy $v_1=-v_2$ and $i_1=-i_2$. This can be constructed in several ways using standard microelectronic components. The SO NOT may include memristors or not depending on the design. One form of the SO NOT is an SO XOR gate with the output terminal fed by a logic 1.

Figure 14A:
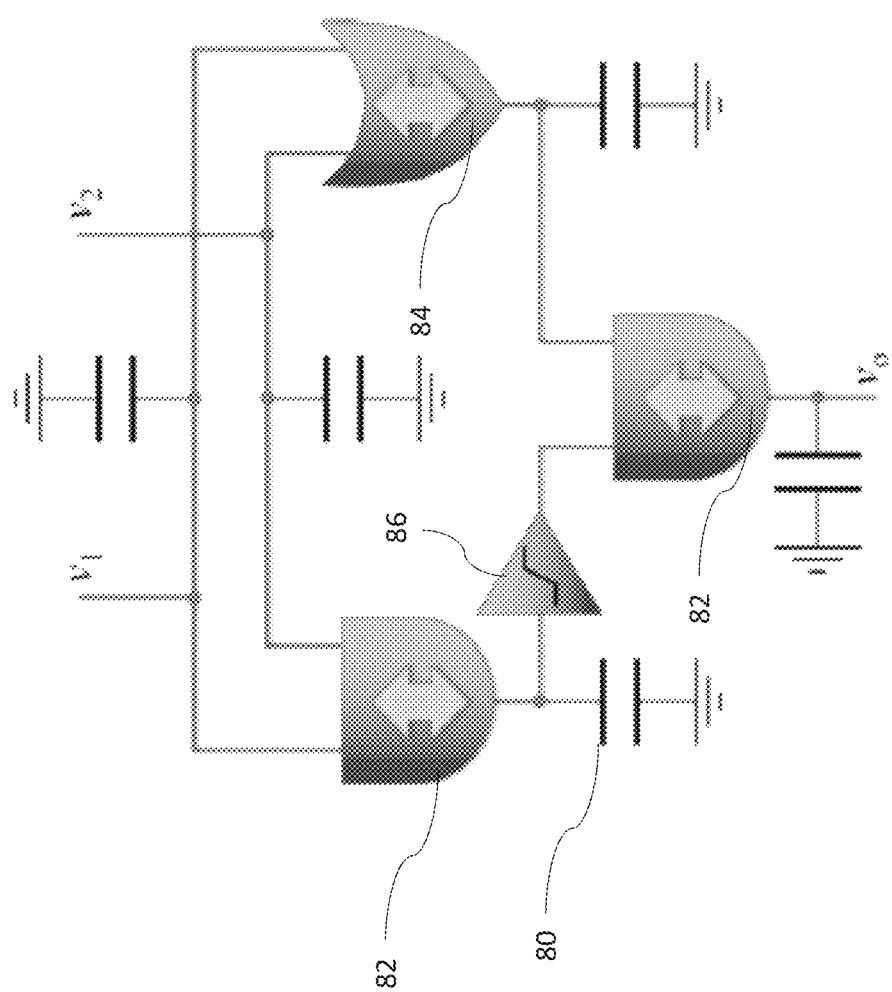
FIG. 14A shows an example SOLC formed from the SOLG of FIGS. 13A-13D, and FIGS. 14B and 14C respectively illustrate a forward mode and reverse mode of the SOLC.

FIG. 14A shows an example SOLC formed from the SOLG of FIGS. 13A-13D. Connections between logic gates should be configured such that the currents used as dynamic correction signal could rise or lower the potentials at nodes. This can be achieved including a small capacitance 80 (small compared to the typical switching time of the memristors) at each node in the connection of SO AND 82, SO XOR 84 and SO NOT 86 gates. The dynamic correction modules are not shown for simplicity of illustration.

Figure 14C:
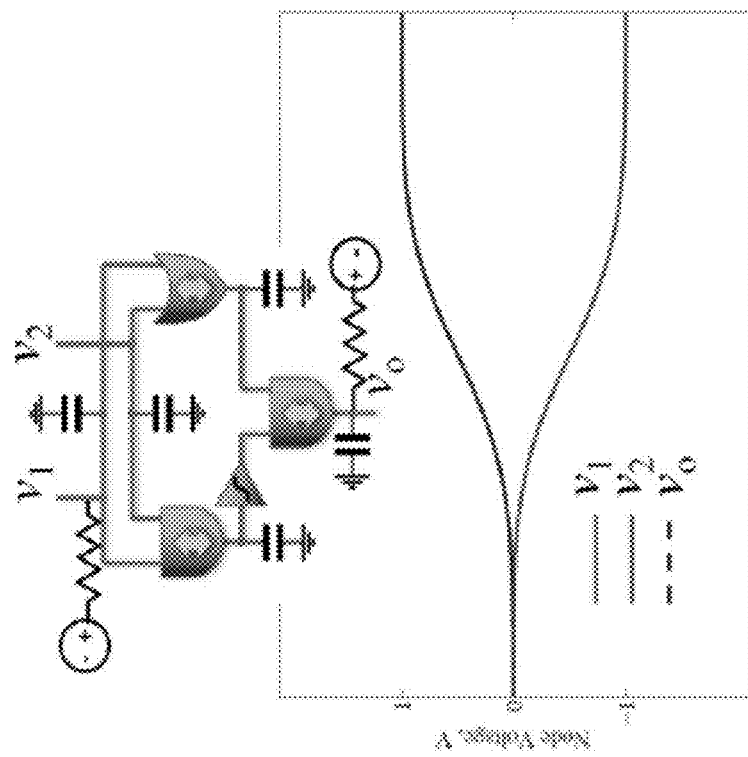
Figure 14B:
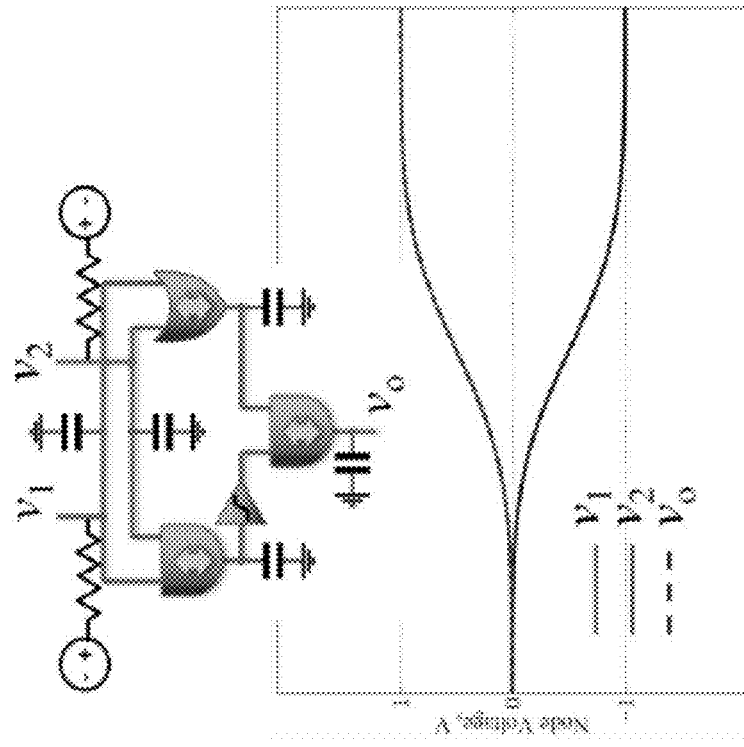

The FIG. 14A SOLC can operate in standard mode, i.e., in forward mode putting the input at the upper terminal as shown FIG. 14B, or in reverse mode shown in FIG. 14C, i.e., apply a value to the output (the lower terminal) and also provide (or not) an input to the upper terminal. In the first case we constrain the gate, and the result is shown (by simulations) in FIGS. 14B and 14C, while in the latter case we give to the gate an extra degree of freedom and the final result will depend on the initial conditions. The reverse mode is possible only with the present SO circuits and not with standard logic circuits known to the inventors.

Figure 15:
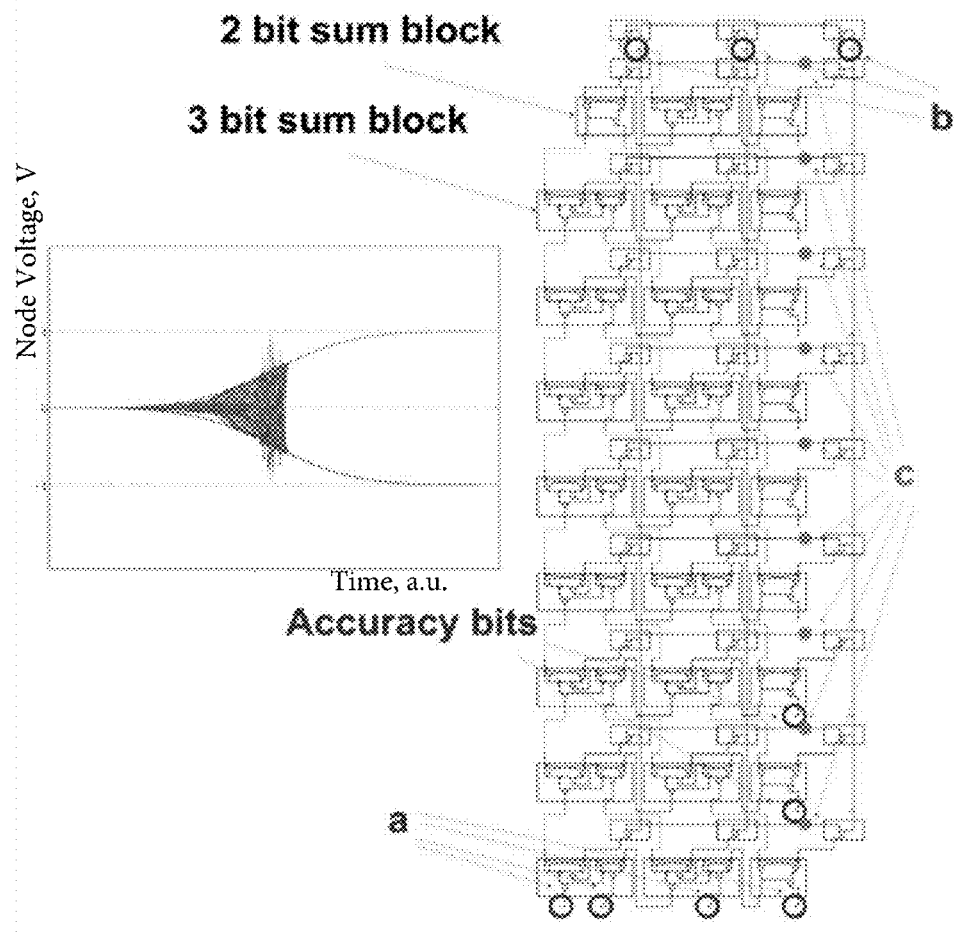
FIG. 15 illustrates an example SOLC that, in one computation step, can determine the quotient of two mantissas with a required accuracy.

Standard algorithms for division of floating point numbers require several steps for dividing the mantissas of two numbers. By contrast, using an SOLC of the invention makes it possible, in one computation step, to determine the quotient of two mantissas with a required accuracy. To state the problem, we want to divide the numbers a and b, i.e., we want to find the number c such that c=a/b. With the SOLC we actually implement cb=a. This implementation in binary representation with finite number of bits requires additional bits for the accuracy of the calculation (an exhaustive treatment of the accuracy of the calculation can be demonstrated and would be understood by artisans, but is not necessary to understand the powerful benefits of the present logic circuits). In order to implement the product in Boolean logic, we need the 2 and 3-bit sum port composed as usual from logic gates. In this way the circuit in FIG. 15 can be constructed. We have performed extensive numerical simulations of these self-organizable logic gates and shown that they operate as expected.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A self-organizing logic circuit comprising self-organizing logic gates, wherein a self-organizing logic gate of the self-organizing logic gates comprises:
   terminals comprising a first set of the terminals and a second set of the terminals;
   memristor devices connected between the first set of the terminals and the second set of the terminals; and
   dynamic correction modules configured to drive an unstable configuration of the self-organizing logic gate toward a stable configuration of the self-organizing logic gate in response to a signal being applied to any of the terminals;
   wherein the self-organizing logic gate is configured to implement a logic function between signals at the terminals, the logic function is not satisfied in the unstable configuration, and the logic function is satisfied in the stable configuration.

2. The self-organizing logic circuit of claim 1, wherein the self-organizing logic circuit is implemented by a non-transitory computer readable medium storing codes to model the self-organizing logic gates.

3. The self-organizing logic circuit of claim 1, wherein the dynamic correction modules comprise the memristor devices.

4. The self-organizing logic circuit of claim 1, wherein each of the dynamic correction modules comprises a resistance or a nonlinear conductance or additional memristor devices or driven voltage generators.

5. The self-organizing logic circuit of claim 1, wherein the self-organizing logic circuit is a physical circuit.

6. The self-organizing logic circuit of claim 5, wherein the memristor devices comprise transistors configured to provide memristive behavior.

7. A computer program product comprising a non-transitory computer-readable medium storing code that, when executed, causes a computer to model a self-organizing logic circuit comprising self-organizing logic gates, wherein a self-organizing logic gate of the self-organizing logic gates comprises:
   terminals comprising a first set of the terminals and a second set of the terminals;
   memristor devices connected between the first set of the terminals and the second set of the terminals; and
   dynamic correction modules configured to drive an unstable configuration of the self-organizing logic gate toward a stable configuration of the self-organizing logic gate in response to a signal being applied to any of the terminals;
   wherein the self-organizing logic gate is configured to implement a logic function between signals at the terminals, the logic function is not satisfied in the unstable configuration, and the logic function is satisfied in the stable configuration.

8. The computer program product of claim 7, wherein each of the dynamic correction modules comprises a resistance, a nonlinear conductance, and additional memristor devices; and wherein the nonlinear conductance has a conductance as a function of voltage v of $G(v)$, wherein $G(v)=-(v-c)(v+c)$, wherein a voltage c encodes a logic 1 and a voltage $-c$ encodes a logic 0.

9. The computer program product of claim 7, wherein the dynamic correction modules comprise the memristor devices.

10. The computer program product of claim 7, wherein the dynamic correction modules comprise a dynamic correction module for each of the terminals.

11. The computer program product of claim 7, wherein the self-organizing logic gate is configurable to implement any one of an AND logic function, an OR logic function, or an XOR logic function as the logic function.

12. The computer program product of claim 7, wherein the self-organizing logic circuit is configured to induce feedback to force the self-organizing logic gate to satisfy the logic function.

13. The computer program product of claim 7, wherein the self-organizing logic circuit comprises an auxiliary circuit connected to a terminal of the terminals of the self-organizing logic gate that does not receive an applied signal from external to the self-organizing logic circuit, and wherein the auxiliary circuit is configured to maintain stable configurations of the self-organizing logic gate.

14. The computer program product of claim 7, wherein substantially no current flows between the first set of the terminals and the second set of the terminals of the self-organizing logic gate in the stable configuration.

15. The computer program product of claim 7, wherein the first set of the terminals comprises a first terminal and a second terminal, the second set of the terminals comprises a third terminal, and the memristor devices comprise a first memristor device connected between the first terminal and the third terminal and a second memristor device connected between the second terminal and the third terminal.

16. A computer system comprising:
  a non-transitory computer-readable medium storing instructions to model a self-organizing logic circuit comprising self-organizing logic gates, wherein a self-organizing logic gate of the self-organizing logic gates comprises:
    terminals comprising a first set of the terminals and a second set of the terminals;
    memristor devices connected between the first set of the terminals and the second set of the terminals; and
    dynamic correction modules configured to drive an unstable configuration of the self-organizing logic gate toward a stable configuration of the self-organizing logic gate in response to a signal being applied to any of the terminals;
    wherein the self-organizing logic gate is configured to implement a logic function between signals at the terminals, the logic function is not satisfied in the unstable configuration, and the logic function is satisfied in the stable configuration; and
  a computer configured to:
    execute the instructions to implement an emulator that models the self-organizing logic-circuit; and
    solve a problem using the emulator.

17. The computer system of claim 16, wherein the self-organizing logic gate is configured to implement forward logic from the first set of the terminals to the second set of the terminals and reverse logic from the second set of the terminals to the first set of the terminals.

18. The computer system of claim 16, wherein the self-organizing logic gate is configurable to implement any one of an AND logic function, an OR logic function, or an XOR logic function as the logic function.

19. The computer system of claim 16, wherein the self-organizing logic circuit is configured to induce feedback to force the self-organizing logic gate to satisfy the logic function.

20. The computer system of claim 16, wherein the self-organizing logic circuit comprises an auxiliary circuit connected to a terminal of the terminals of the self-organizing logic gate, wherein the auxiliary circuit is configured to maintain the stable configuration of the self-organizing logic gate.

* * * * *